United States Patent
Kim et al.

(10) Patent No.: US 9,893,137 B2
(45) Date of Patent: Feb. 13, 2018

(54) ORGANIC LIGHT EMITTING DISPLAY PANEL AND METHOD OF MANUFACTURING THE SAME

(71) Applicant: SAMSUNG DISPLAY CO., LTD., Yongin-si, Gyeonggi-Do (KR)

(72) Inventors: Min-Soo Kim, Seoul (KR); Valeriy Prushinskiy, Hwaseong-si (KR); Mu-Gyeom Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/184,932

(22) Filed: Jun. 16, 2016

(65) Prior Publication Data

US 2017/0062540 A1 Mar. 2, 2017

(30) Foreign Application Priority Data

Aug. 25, 2015 (KR) .................. 10-2015-0119645

(51) Int. Cl.
*H01L 29/08* (2006.01)
*H01L 27/32* (2006.01)

(52) U.S. Cl.
CPC ...... *H01L 27/3272* (2013.01); *H01L 27/3246* (2013.01); *H01L 27/3248* (2013.01); *H01L 27/3258* (2013.01); *H01L 2227/323* (2013.01)

(58) Field of Classification Search
CPC ............. H01L 27/3272; H01L 27/3246; H01L 27/3258; H01L 27/3248; H01L 2227/323
USPC ......................................................... 257/40
See application file for complete search history.

(56) References Cited

U.S. PATENT DOCUMENTS

| 8,933,625 | B2 | 1/2015 | Chung et al. | |
| 2012/0299472 | A1* | 11/2012 | Chung | H01L 51/5271 313/504 |
| 2013/0009194 | A1* | 1/2013 | Yamazaki | H01L 51/524 257/99 |
| 2014/0332150 | A1* | 11/2014 | Hirakata | B32B 38/10 156/247 |
| 2015/0370116 | A1* | 12/2015 | Chae | G02F 1/13394 349/43 |

FOREIGN PATENT DOCUMENTS

| KR | 10-2007-0070358 A | 7/2007 |
| KR | 10-2009-0099744 A | 9/2009 |
| KR | 10-2014-0073216 A | 6/2014 |
| KR | 10-2014-0122132 A | 10/2014 |

* cited by examiner

*Primary Examiner* — Vu A Vu
(74) *Attorney, Agent, or Firm* — Innovation Counsel LLP

(57) ABSTRACT

An organic light emitting display panel includes a first base substrate, a thin film transistor disposed on the first base substrate, a first electrode electrically connected to the thin film transistor, a pixel defining layer defining an opening that exposes a portion of the first electrode, a second electrode disposed on the first electrode, a light emitting structure disposed between the first electrode and the second electrode, a second base substrate disposed on the second electrode, and a first mirror layer disposed on the second base substrate and defining an opening that overlaps the light emitting structure. At least one of the pixel defining layer and the mirror layer has an uneven surface.

16 Claims, 30 Drawing Sheets

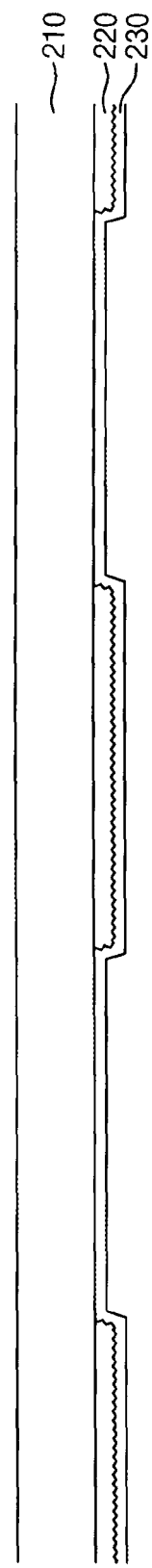

ORGANIC LIGHT EMITTING DISPLAY PANEL AND METHOD OF MANUFACTURING THE SAME

This application claims priority under 35 U.S.C. § 119 to Korean Patent Application No. 10-2015-0119645, filed on Aug. 25, 2015, the disclosure of which is incorporated by reference herein in its entirety.

BACKGROUND

1. Field

The present disclosure relates to an organic light emitting display panel, more particularly, an organic light emitting display panel that can operate in mirror and display modes, and a method of manufacturing the organic light emitting display panel.

2. Description of the Related Art

A display device displays an image using light emitting pixels. An organic light emitting display device includes pixels having an organic light emitting diode (OLED). The OLED emits light of a wavelength band that depends on an organic material included in the OLED. For example, the OLED includes an organic material corresponding to one of a red color, a green color, and a blue color. The organic light emitting display device displays an image by mixing the colored lights emitted by the organic materials.

Recently, demands for display devices that can operate in both mirror and display modes have increased. However, such a dual-mode display may exhibit a lower display quality than a single-mode display.

SUMMARY

One or more exemplary embodiments of the present disclosure provide an organic light emitting display panel with an enhanced display quality.

One or more exemplary embodiments of the present disclosure also provide a method of manufacturing the organic light emitting display panel.

According to an exemplary embodiment of the present disclosure, an organic light emitting display panel includes a first base substrate, a thin film transistor disposed on the first base substrate, a first electrode electrically connected to the thin film transistor, a pixel defining layer defining an opening that exposes a portion of the first electrode, a second electrode disposed on the first electrode, a light emitting structure disposed between the first electrode and the second electrode, a second base substrate disposed on the second electrode, and a first mirror layer disposed on the second base substrate and defining an opening that overlaps the light emitting structure. At least one of the pixel defining layer and the mirror layer has an uneven surface.

In an exemplary embodiment, the first mirror layer may include a first surface that is in parallel with a surface of the second base substrate and a side surface that connects the first surface and the surface of the second base substrate each other. The first surface and the side surface may be uneven.

In an exemplary embodiment, the organic light emitting display panel may further include a second mirror layer that makes contact with the first mirror layer to cover the first mirror layer.

In an exemplary embodiment, a second surface of the second mirror layer that overlaps the first surface of the first mirror layer may be even.

In an exemplary embodiment, the pixel defining layer may include an upper surface that is in parallel with a surface of the first base substrate and a side surface. The upper surface of the pixel defining layer is uneven, and the side surface of the pixel defining layer may be even.

In an exemplary embodiment, the pixel defining layer may include a first portion and a second portion that are disposed between the first electrode and a first electrode of an adjacent pixel. The first portion may be spaced apart from the second portion in a cross-sectional view.

According to an exemplary embodiment of the present disclosure, an organic light emitting display panel includes a first base substrate, a thin film transistor disposed on the first base substrate, a first electrode electrically connected to the thin film transistor, a pixel defining layer defining an opening that exposes a portion of the first electrode, a second electrode disposed on the first electrode, a light emitting structure disposed between the first electrode and the second electrode, a second base substrate disposed on the second electrode, and a first mirror layer disposed on the second base substrate and defining an opening that overlaps the light emitting structure. A light blocking element is formed between the first electrode and a first electrode of an adjacent pixel.

In an exemplary embodiment, the pixel defining layer may include first and second portions that are disposed between the first electrode and a first electrode of the adjacent pixel. The first portion may be spaced apart from the second portion in a cross-sectional view. The light blocking element may be a side surface of the first portion and a side surface of the second portion.

In an exemplary embodiment, the organic light emitting display panel may further include a light blocking pattern disposed between the first portion and the second portion.

In an exemplary embodiment, the light blocking pattern may include an organic material.

In an exemplary embodiment, the organic light emitting display panel may further include a light blocking pattern disposed between the first electrode and a first electrode of the adjacent pixel. The light blocking element may be the light blocking pattern.

In an exemplary embodiment, a height of the light blocking pattern from the first electrode may be higher than a height of light emitting structure from the first electrode.

In an exemplary embodiment, the organic light emitting display panel may further include a planarization layer that covers the thin film transistor and makes contact with the pixel defining layer. The planarization layer may further include a light blocking portion protruded from an upper surface of the planarization layer. The light blocking element may be the light blocking portion.

In an exemplary embodiment, a height of the light blocking pattern from the first base substrate may be higher than a height of light emitting structure from the first base substrate.

According to an exemplary embodiment of the present disclosure, a method of manufacturing an organic light emitting display panel includes forming a thin film transistor on a first base substrate, forming a planarization layer on the thin film transistor, forming a light blocking element configured to prevent mixing of light between adjacent pixels, forming a first electrode on the planarization layer, forming a pixel defining layer on the planarization layer, forming a light emitting structure on the first electrode, forming a second electrode on the light emitting structure and the pixel defining layer, and forming a first mirror layer on a second base substrate.

In an exemplary embodiment, the method may further include forming unevenness on a surface of the first mirror layer. Forming the light blocking element may include forming the unevenness.

In an exemplary embodiment, the pixel defining layer may include a first portion and a second portion that are disposed between the first electrode and a first electrode of an adjacent pixel. The first portion may be spaced apart from the second portion in a cross-sectional view. The light blocking element may be a side surface of the first portion and a side surface of the second portion.

In an exemplary embodiment, forming the light blocking element may include forming unevenness on the pixel defining layer.

In an exemplary embodiment, the planarization layer may further include a light blocking portion protruded from an upper surface of the planarization layer, and the light blocking element is the light blocking portion.

In an exemplary embodiment, forming the light blocking element may include forming a light blocking pattern on the planarization layer.

According to the exemplary embodiments of the present disclosure, an organic light emitting display panel includes a light blocking element dispose between adjacent pixels. Although light emitted from a light emitting structure passes to an adjacent pixel through a pixel defining layer, the light may be reflected, refracted or blocked by the light blocking element such as a first light blocking pattern, a second light blocking pattern, unevenness, surfaces of first and second portion of the pixel defining layer so that the light may not pass to the adjacent pixel. Thus, mixture of lights emitting from different pixels may be decreased so that the display quality may be improved.

BRIEF DESCRIPTION OF THE DRAWINGS

The above and other features of the present disclosure will become more apparent by describing in detail exemplary embodiments thereof with reference to the accompanying drawings, in which:

FIGS. 9A to 9J are cross-sectional views illustrating a method of manufacturing the organic light emitting display panel of FIG. 8;

DETAILED DESCRIPTION

Hereinafter, the inventive concept will be explained in detail with reference to the accompanying drawings.

Figure 1:
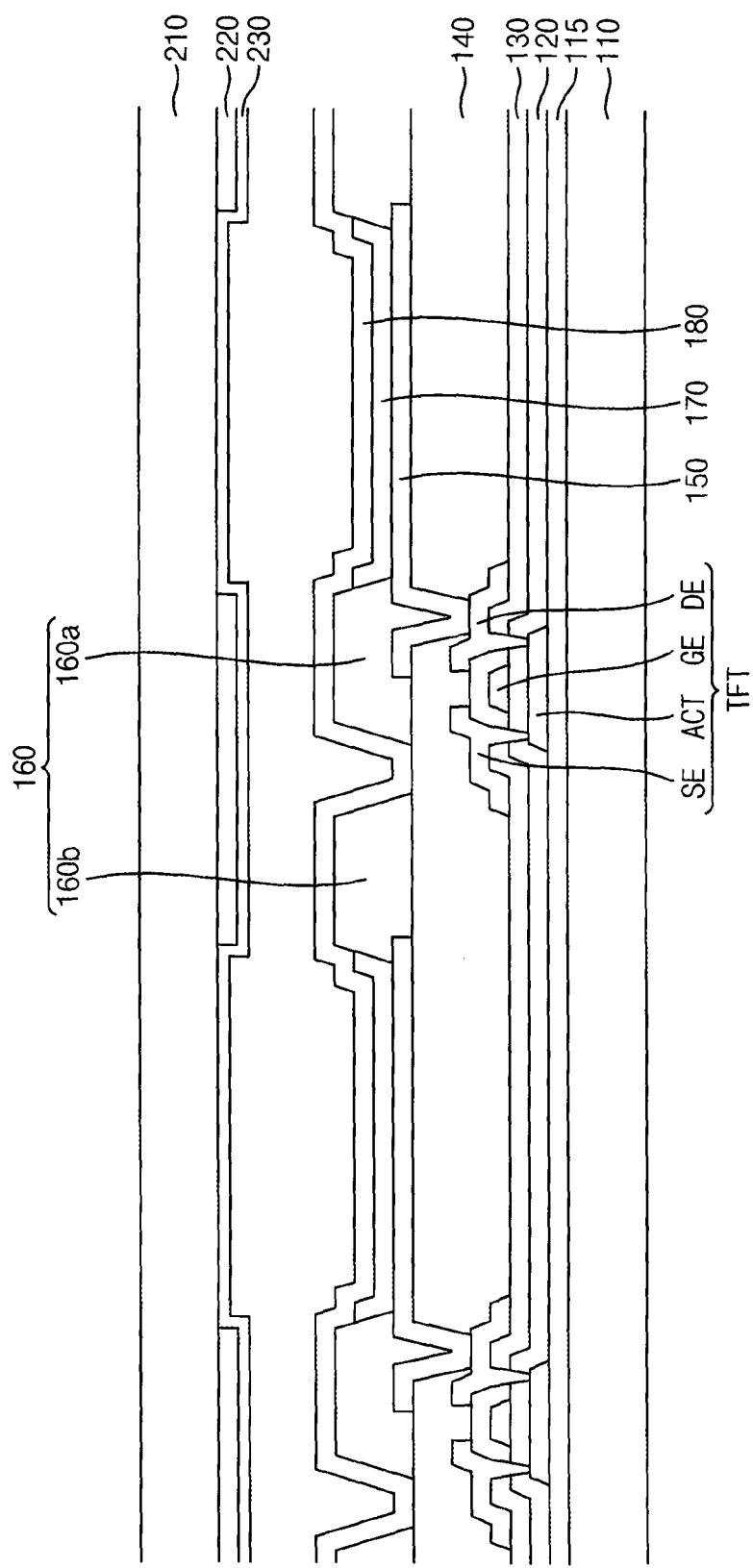
FIG. 1 is a cross-sectional view illustrating an organic light emitting display panel, according to an exemplary embodiment.

FIG. 1 is a cross-sectional view illustrating an organic light emitting display panel, according to an exemplary embodiment. The organic light emitting display panel includes a first base substrate 110, a buffer layer 115, a first insulation layer 120, a thin film transistor TFT, a second insulation layer 130, a planarization layer 140, a first electrode 150, a pixel defining layer 160, a light emitting structure 170, a second electrode 180, a first mirror layer 220, a second mirror layer 230, and a second base substrate 210.

The first base substrate 110 may include a transparent insulation substrate. For example, the first base substrate 110 may include a glass substrate, a quartz substrate, a transparent resin substrate, etc. Examples of the transparent resin substrate for the first base substrate 110 may include polyimide-based resin, acryl-based resin, polyacrylate-based resin, polycarbonate-based resin, polyether-based resin, sulfonic acid containing resin, polyethyleneterephthalate-based resin, etc.

The buffer layer 115 may be disposed on the first base substrate 110. The buffer layer 115 may prevent diffusion of metal atoms and/or impurities from the first base substrate 110. Additionally, the buffer layer 115 may adjust a heat transfer rate of a successive crystallization process, which will be discussed later in further details, to form a substantially uniform active pattern ACT. The buffer layer 115 may improve flatness of an irregular surface of the first base substrate 110. The buffer layer 115 may be formed using a silicon compound. For example, the buffer layer 115 may include silicon oxide (SiOx), silicon nitride (SiNx), silicon oxynitride (SiOxNy), silicon oxycarbide (SiOxCy), silicon carbon nitride (SiCxNy), etc. These silicon compounds may be used alone or in a mixture thereof. The buffer layer 115 may have a single layer structure or a multi layer structure. For example, the buffer layer 115 may have a single-layered structure including a silicon oxide film, a silicon nitride film, a silicon oxynitride film, a silicon oxycarbide film, or a silicon carbon nitride film. Alternatively, the buffer layer 115 may have a multilayered structure including at least two of a silicon oxide film, a silicon nitride film, a silicon oxynitride film, a silicon oxycarbide film, a silicon carbon nitride film, etc.

The active pattern ACT may be disposed on the buffer layer 115. The active pattern ACT may include impurity-doped source and drain areas and a channel area between the source area and the drain area.

The first insulation layer 120 may be disposed on the first base substrate 110 on which the active pattern ACT is disposed. The first insulation layer 120 may include a silicon compound, metal oxide, etc. For example, the first insulation layer 120 may be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These silicon compounds and metal oxides may be used alone or in a combination thereof. In addition, the first insulation layer 120 may have a single layer structure or a multi layer structure including the silicon oxide and/or the silicon nitride. In example embodiments, the first insulation layer 120 may be uniformly formed on the first base substrate 110 along a profile of the active pattern ACT. The first insulation layer 120 may have a substantially small thickness such that a stepped portion may be formed at a portion of the first insulation layer 120 adjacent to the active pattern ACT. In some example embodiments, the first insulation layer 120 may have a relatively large thickness for sufficiently covering the active pattern ACT so that the first insulation layer 120 may have a substantially leveled surface.

A gate pattern may be disposed on the first insulation layer 120. The gate pattern may include metal, alloy, conductive metal oxide, a transparent conductive material, etc. The gate pattern may include a gate electrode GE overlapped with the active pattern ACT, a signal line such as a gate line configured to transmit signals to drive the pixels, a first storage electrode, etc.

The second insulation layer 130 may be disposed on the first insulation layer 120 on which the gate pattern is disposed. The second insulation layer 130 may insulate the gate electrode GE from a source electrode SE and a drain electrodes DE. The second insulation layer 130 may be uniformly formed on the first insulation layer 120 along a profile of the gate pattern. The second insulation layer 130 may have a substantially small thickness such that a stepped portion may be formed at a portion of the second insulation layer 130 adjacent to the gate pattern. The second insulation layer 130 may include a silicon compound, etc. For example, the second insulation layer 130 may be formed using silicon oxide (SiOx), silicon nitride (SiNx), silicon oxynitride (SiOxNy), etc.

A data pattern may be disposed on the second insulation layer 130. The data pattern may include the source electrode SE, the drain electrode DE, and a signal line such as a data line configured to transmit signals to drive the pixels, a second storage electrode, etc. The source electrode SE may be electrically connected to the active pattern ACT through a contact hole formed through the first and second insulation layers 120 and 130.

The active pattern ACT, the gate electrode GE, the source electrode SE, and the drain electrode DE may be included in the thin film transistor TFT.

The planarization layer 140 may be disposed on the second insulation layer 130 on which the thin film transistors TFT is disposed. The planarization layer 140 may have a single-layered structure or a multi-layered structure including at least two insulation films. The planarization layer 140 may be may be formed using an organic material. For example, the planarization layer 140 may include photoresist, acryl-based resin, polyimide-based resin, polyamide-based resin, siloxane-based resin, etc. These organic material layers may be used alone or in a combination thereof. Alternatively, the planarization layer 140 may include an inorganic material. For example, the planarization layer 140 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These inorganic material layers may be used alone or in a mixture thereof.

The first electrode 150 may be disposed on the planarization layer 140. The first electrode 150 may be connected to the drain electrode DE through a contact hole that is formed through the planarization layer 140.

In some example embodiments, a contact, a plug, or a pad may be formed in the contact hole, and then the first electrode 150 may be formed on the contact, the plug, or the pad. The first electrode 150 may be electrically connected to the drain electrode DE through the contact, the plug, or the pad.

The display apparatus may have a front emission type structure including the first electrode 150 formed of a reflective material. For example, the first electrode 150 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in a combination thereof. In example embodiments, the first electrode 150 may have a single layer structure or a multi layer structure.

The pixel defining layer 160 may be disposed on the planarization layer 140 on which the first electrode 150 is formed. The pixel defining layer 160 may define an opening to expose a portion of the first electrode 150. The pixel defining layer 160 may include a transparent organic material or a transparent inorganic material. For example, the pixel defining layer 160 may be formed using photoresist, acryl-based resin, polyacryl-based resin, polyimide-based resin, a silicon compound, etc.

The pixel defining layer 160 may include a first portion 160a and a second portion 160b. The first portion 160a may make contact with the first electrode 150. The second portion 160b may make contact with a first electrode of an adjacent pixel. The first portion 160a and the second portion 160b may be spaced apart from each other in a cross-sectional view.

Accordingly, although light ed from the light emitting structure 170 passes to the adjacent pixel through the pixel defining layer 160, the light may be reflected or refracted on surfaces of the first portion 160a and the second portion 160b of the pixel defining layer 160 so that the light may not pass to the adjacent pixel. Thus, mixture of light emitting from different pixels may be decreased so that the display quality may be improved.

The light emitting structure 170 may be positioned on the first electrode 150 exposed by the opening of the pixel defining layer 160. The light emitting structure 170 may extend on a sidewall of the opening of the pixel defining layer 160. The light emitting structure 170 may include an organic light emitting layer (EL), a hole injection layer (HIL), a hole transfer layer (HTL), an electron transfer layer (ETL), an electron injection layer (EIL), etc. In example embodiments, a plurality of organic light emitting layers may be formed using light emitting materials for generating different colors of light such as a red color of light, a green color of light and a blue color of light in accordance with color pixels of the display device. In some example embodiments, the organic light emitting layer of the of the light emitting structure 170 may include a plurality of stacked light emitting materials for generating a red color of light, a green color of light and a blue color of light to emit a white color of light.

The second electrode 180 may be disposed on the light emitting structure 170 and the pixel defining layer 160. The display apparatus may have a front emission type structure including the second electrode 180 formed of a transmissive material. For example, the second electrode 180 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in a combination thereof. In example embodiments, the second electrode 180 may also have a single layer structure or a multi layer structure including one or more of a metal film, an alloy film, a metal nitride film, a conductive metal oxide film, and a transparent conductive film.

The second base substrate 210 may be disposed on the second electrode 180. The second base substrate 210 may include a glass substrate, a quartz substrate, a transparent resin substrate, etc. Examples of the transparent resin substrate for the second base substrate 210 may include polyimide-based resin, acryl-based resin, polyacrylate-based resin, polycarbonate-based resin, polyether-based resin, sulfonic acid containing resin, polyethyleneterephthalate-based resin, etc.

In example embodiments, a predetermined space may be provided between the second electrode 180 and the second base substrate 120. This space may be filled with an air or an inactive gas such as a nitrogen ($N_2$) gas. In some example embodiments, a protection layer (not illustrated) may be additionally disposed between the second electrode 180 and the second base substrate 210. The protection layer may include a resin, for example, photoresist, acryl-based resin, polyimide-based resin, polyamide-based resin, siloxane-based resin, etc. These resins may be used or in a combination thereof.

The first mirror layer 220 may be disposed on the second base substrate 210. The first mirror layer 220 may define an opening corresponding to the light emitting structure 180. The first mirror layer 220 may include a material having high reflectivity such as metal to reflect external light. For example, the first mirror layer 220 may include aluminum (Al), chrome (Cr), silver (Ag), iron (Fe), platinum (Pt), mercury (Hg), nickel (Ni), tungsten (W), vanadium (V), molybdenum (Mo), etc. In some example embodiment, the first mirror layer 220 may have a multi layer structure having a transparent conductive metal oxide layer and a metal layer. For example, the first mirror layer 220 may include ITO/Ag/ITO triple layers.

The second mirror layer 230 may be disposed on the second base substrate 210 on which the first mirror layer 220 is disposed. The second mirror layer 230 may include a material that is the same as that of the first mirror layer 220 or different from that of the first mirror layer 220. The thickness of the second mirror layer 230 may be smaller than the thickness of the first mirror layer 220. The second mirror layer 230 may partially reflect and partially transmit external light in the opening in a plan view. The second mirror layer 230 may include a material having high reflectivity such as metal to reflect external light. For example, the second mirror layer 230 may include aluminum (Al), chrome (Cr), silver (Ag), iron (Fe), platinum (Pt), mercury (Hg), nickel (Ni), tungsten (W), vanadium (V), molybdenum (Mo), etc. In some example embodiment, the first mirror layer 230 may have a multi layer structure having a transparent conductive metal oxide layer and a metal layer. For example, the second mirror layer 230 may include ITO/Ag/ITO triple layers. The second mirror layer 230 may cover a boundary of the first mirror layer 220 so that blurring caused by scattered reflection at the boundary of the first mirror layer 220 may be decreased.

Figure 2:
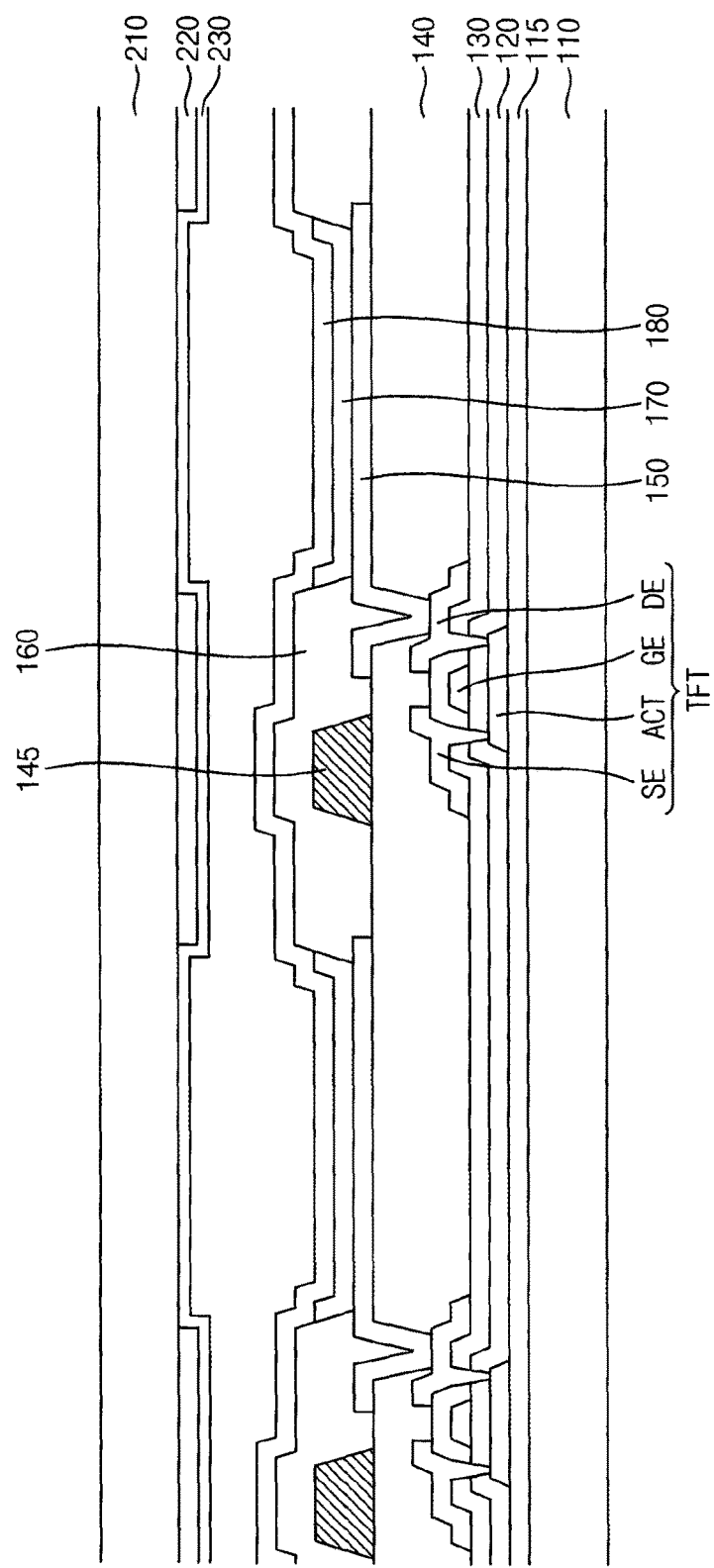
FIG. 2 is a cross-sectional view illustrating an organic light emitting display panel, according to an exemplary embodiment.

FIG. 2 is a cross-sectional view illustrating an organic light emitting display panel, according to an exemplary embodiment. The organic light emitting display panel is substantially same as the organic light emitting display panel of FIG. 1 except for a first light blocking pattern 145 and a pixel defining layer 160. Thus, detailed descriptions concerning the same elements will be briefly described or omitted.

The organic light emitting display panel may include a first base substrate 110, a buffer layer 115, a first insulation layer 120, a thin film transistor TFT, a second insulation layer 130, a planarization layer 140, a first light blocking layer 145, a first electrode 150, a pixel defining layer 160, a light emitting structure 170, a second electrode 180, a first mirror layer 220, a second mirror layer 230, and a second base substrate 210.

The first base substrate 110 may include a transparent insulation substrate. The buffer layer 115 may be disposed on the first base substrate 110. The active pattern ACT may be disposed on the buffer layer 115. The first insulation layer 120 may be disposed on the first base substrate 110 on which the active pattern ACT is disposed. A gate pattern including a gate electrode GE may be disposed on the first insulation layer 120. The second insulation layer 130 may be disposed on the first insulation layer 120 on which the gate pattern is disposed. A data pattern including a source electrode SE and a drain electrode DE may be disposed on the second insulation layer 130. The active pattern ACT, the gate electrode GE, the source electrode SE, and the drain electrode DE may be included in the thin film transistor TFT. The planarization layer 140 may be disposed on the second insulation layer 130 on which the thin film transistors TFT is disposed. The first electrode 150 may be disposed on the planarization layer 140.

The first light blocking pattern 145 may be disposed on the planarization layer 140. The first light blocking pattern 145 may be disposed between the first electrode 150 and a first electrode of an adjacent pixel. The first light blocking pattern 145 may include a light-blocking material. For example, the first light blocking pattern 145 may include a metal, a metal oxide, an organic material, an inorganic material, etc. The first light blocking pattern 145 may have an enough height to block light. For example, an upper surface of the first light blocking pattern 145 may be formed higher than an upper surface of the light emitting structure 170.

Accordingly, although light emitted from the light emitting structure 170 passes to the adjacent pixel through the pixel defining layer 160, the light may be blocked by the first light blocking pattern 145 so that the light may not pass to the adjacent pixel. Thus, mixture of lights emitting from different pixels may be decreased so that the display quality may be improved.

The pixel defining layer 160 may be disposed on the planarization layer 140 on which the first electrode 150 and the first light blocking pattern 145 are formed. The pixel defining layer 160 may define an opening to expose a portion of the first electrode 150. The pixel defining layer 160 may include a transparent organic material or a transparent inorganic material. For example, the pixel defining layer 160 may be formed using photoresist, acryl-based resin, polyacryl-based resin, polyimide-based resin, a silicon compound, etc. The pixel defining layer 160 may cover the entire surface of the first light blocking pattern 145. A stepped portion may be formed at a portion of the pixel defining layer 160 adjacent to the first light blocking pattern 145. In some example embodiments, the pixel defining layer 160 may have a relatively small thickness adjacent to the first light blocking pattern 145 so that the first insulation layer 120 may have a substantially leveled surface.

The light emitting structure 170 may be positioned on the first electrode 150 exposed by the opening of the pixel defining layer 160. The second electrode 180 may be disposed on the light emitting structure 170 and the pixel defining layer 160. The second base substrate 210 may be disposed on the second electrode 180. The first mirror layer 220 may be disposed on the second base substrate 210. The second mirror layer 230 may be disposed on the second base substrate 210 on which the first mirror layer 220 is disposed.

Figure 3:
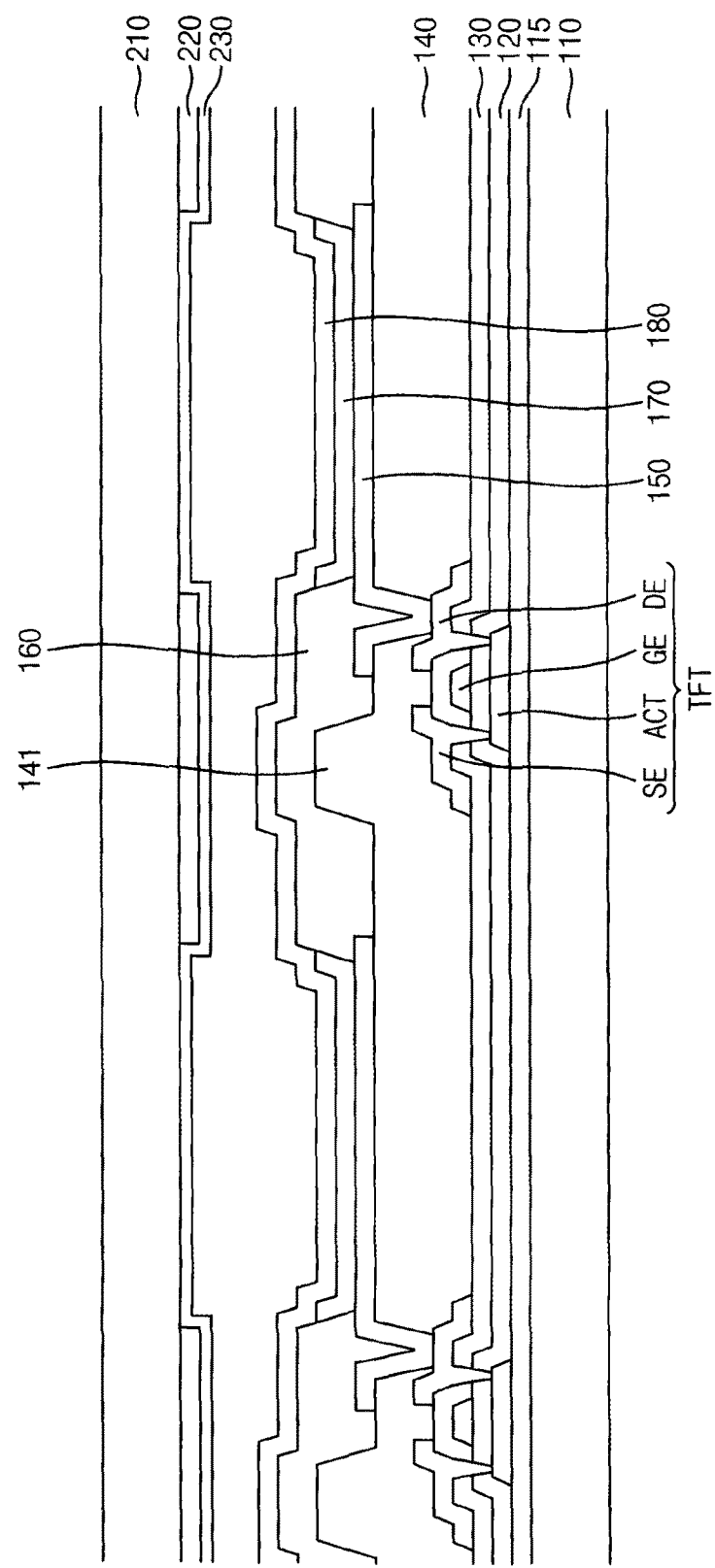
FIG. 3 is a cross-sectional view illustrating an organic light emitting display panel, according to an exemplary embodiment.

FIG. 3 is a cross-sectional view illustrating an organic emitting display panel, according to an exemplary embodiment. The organic light emitting display panel is substantially same as the organic light emitting display panel of FIG. 1 except for a planarization layer 140 and a pixel defining layer 160. Thus, detailed descriptions concerning the same elements will be briefly described or omitted.

The organic light emitting display panel may include a first base substrate 110, a buffer layer 115, a first insulation layer 120, a thin film transistor TFT, a second insulation layer 130, a planarization layer 140, a first electrode 150, a pixel defining layer 160, a light emitting structure 170, a second electrode 180, a first mirror layer 220, a second mirror layer 230, and a second base substrate 210.

The first base substrate 110 may include a transparent insulation substrate. The buffer layer 115 may be disposed on the first base substrate 110. The active pattern ACT may be disposed on the buffer layer 115. The first insulation layer 120 may be disposed on the first base substrate 110 on which the active pattern ACT is disposed. A gate pattern including a gate electrode GE may be disposed on the first insulation layer 120. The second insulation layer 130 may be disposed on the first insulation layer 120 on which the gate pattern is disposed. A data pattern including a source electrode SE and a drain electrode DE may be disposed on the second insulation layer 130. The active pattern ACT, the gate electrode GE the source electrode SE, and the drain electrode DE may be included in the thin film transistor TFT.

The planarization layer 140 may be disposed on the second insulation layer 130 on which the thin film transistors TFT is disposed. The planarization layer 140 may have a single-layered structure or a multi-layered structure including at least two insulation films. The planarization layer 140 may be may be formed using an organic material. For example, the planarization layer 140 may include photoresist, acryl-based resin, polyimide-based resin, polyamide-based resin, siloxane-based resin, etc. These organic materials may be used alone or in a combination thereof. Alternatively, the planarization layer 140 may include an inorganic material. For example, the planarization layer 140 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These inorganic materials may be used alone or in a mixture thereof.

The planarization layer 140 may include a light blocking portion 141. The light blocking portion 141 may be disposed between the first electrode 150 and a first electrode of an adjacent pixel, and protruded from the planarization layer 140. The planarization layer 140 may be transparent or opaque. When the planarization layer 140 is opaque, the light blocking portion 141 may effectively block light. When the planarization layer 140 is transparent, light may be reflected or refracted on a surface that makes contact with the light blocking portion 141 and the pixel defining layer 160 so that the light emitting from the light emitting structure 170 may not pass to the adjacent pixel. The light blocking portion 141 may have an enough height to block light. For example, an upper surface of the light blocking portion 141 may be formed higher than an upper surface of the light emitting structure 170.

Accordingly, although light emitted from the light emitting structure 170 passes to the adjacent pixel through the pixel defining layer 160, the light may be blocked by the light blocking portion 141 so that the light may not pass to the adjacent pixel. Thus, mixture of lights emitting from different pixels may be decreased so that the display quality may be improved.

The first electrode 150 may be disposed on the planarization layer 140. The pixel defining layer 160 may be disposed on the planarization layer 140 on which the first electrode 150 is formed. The light emitting structure 170 may be positioned on the first electrode 150 exposed by the opening of the pixel defining layer 160. The second electrode 180 may be disposed on the light emitting structure 170 and the pixel defining layer 160. The second base substrate 210 may be disposed on the second electrode 180. The first mirror layer 220 may be disposed on the second base substrate 210. The second mirror layer 230 may be disposed on the second base substrate 210 on which the first mirror layer 220 is disposed.

Figure 4:
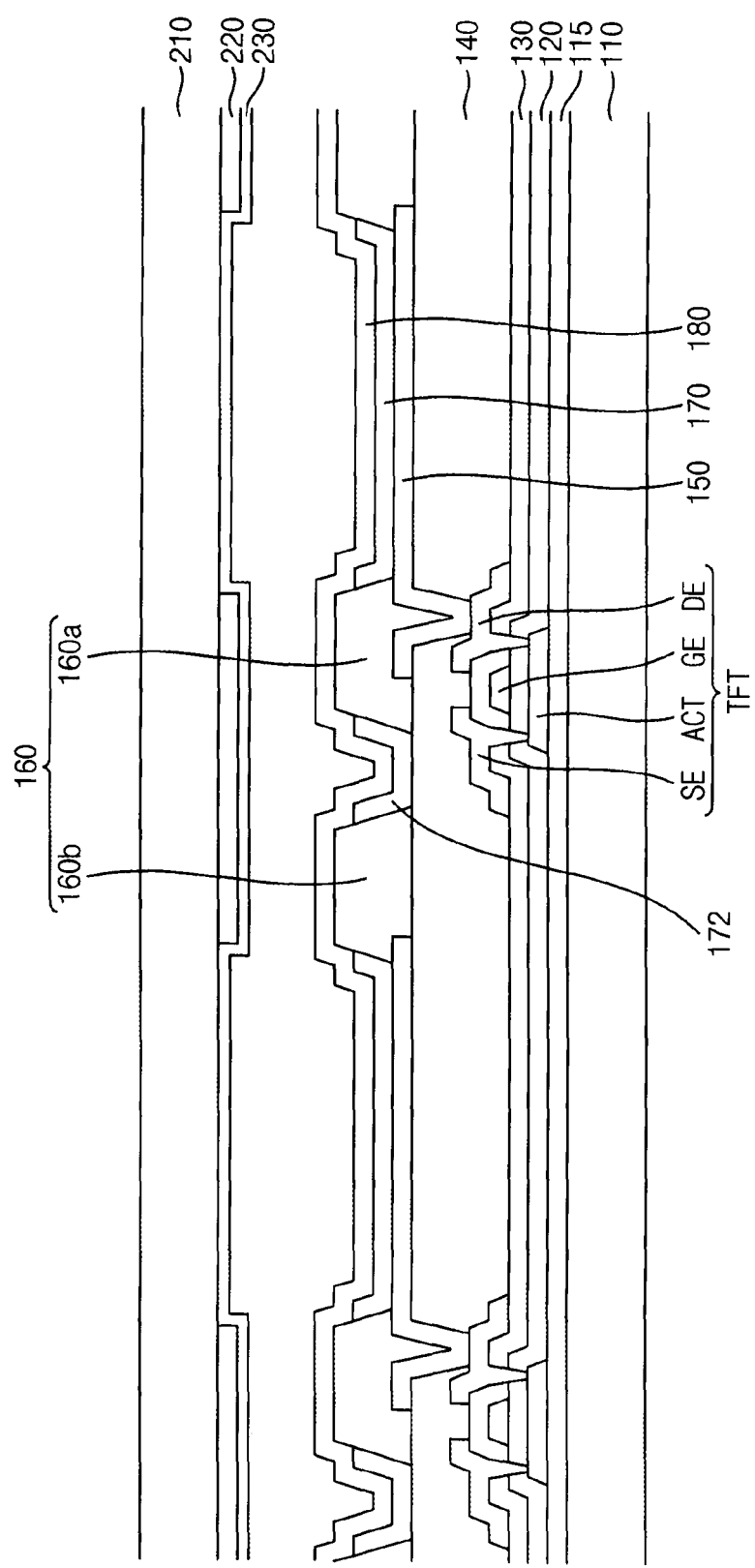
FIG. 4 is a cross-sectional view illustrating an organic light emitting display panel, according to an exemplary embodiment.

FIG. 4 is a cross-sectional view illustrating an organic light emitting display panel, according to an exemplary embodiment. The organic light emitting display panel is substantially same as the organic light emitting display panel of FIG. 1 except for a second light blocking pattern 172 and a pixel defining layer 160. Thus, detailed descriptions concerning the same elements will be briefly described or omitted.

The organic light emitting display panel may include a first base substrate 110, a buffer layer 115, a first insulation layer 120, a thin film transistor TFT, a second insulation layer 130, a planarization layer 140, a first light blocking layer 145, a first electrode 150, a pixel defining layer 160, a light emitting structure 170, a second light blocking pattern 172, a second electrode 180, a first mirror layer 220, a second mirror layer 230, and a second base substrate 210.

The first base substrate 110 may include a transparent insulation substrate. The buffer layer 115 may be disposed on the first base substrate 110. The active pattern ACT may be disposed on the buffer layer 115. The first insulation layer 120 may be disposed on the first base substrate 110 on which the active pattern ACT is disposed. A gate pattern including a gate electrode GE may be disposed on the first insulation layer 120. The second insulation layer 130 may be disposed on the first insulation layer 120 on which the gate pattern is disposed. A data pattern including a source electrode SE and a drain electrode DE may be disposed on the second insulation layer 130. The active pattern ACT, the gate electrode GE, the source electrode SE, and the drain electrode DE may be included in the thin film transistor TFT. The planarization layer 140 may be disposed on the second insulation layer 130 on which the thin film transistor TFT is disposed. The first electrode 150 may be disposed on the planarization layer 140.

The pixel defining layer 160 may be disposed on the planarization layer 140 on which the first electrode 150 is disposed. The pixel defining layer 160 may define an opening to expose a portion of the first electrode 150. The pixel defining layer 160 may include a transparent organic material or a transparent inorganic material. For example, the pixel defining layer 160 may be formed using photoresist, acryl-based resin, polyacryl-based resin, polyimide-based resin, a silicon compound, etc.

The pixel defining layer 160 may include a first portion 160a and a second portion 160b. The first portion 160a may make contact with the first electrode 150. The second portion 160b may make contact with a first electrode of an adjacent pixel. The first portion 160a and the second portion 160b may be spaced apart from each other in a cross-sectional view.

The second light blocking pattern 172 may be disposed on the planarization layer 140, a side surface of the first portion 160a, and a side surface of the second portion 160b between the first portion 160a and the second portion 160b. The second light blocking pattern 172 may include a material that is same as the one included in the light blocking structure 170. In some example embodiment, the second light blocking pattern 172 may include a light-blocking material. For example, the second light blocking pattern 172 may include an organic light-blocking material.

Accordingly, although light emitted from the light emitting structure 170 passes to the adjacent pixel through the pixel defining layer 160, the light may be blocked by the second light blocking pattern 172 between the first portion 160a and the second portion 160b or reflected or refracted on the light blocking pattern 172 so that the light may not pass to the adjacent pixel. Thus, mixture of lights emitting from different pixels may be decreased so that the display quality may be improved.

The light emitting structure 170 may be positioned on the first electrode 150 exposed by the opening of the pixel defining layer 160. The second electrode 180 may be disposed on the light emitting structure 170 and the pixel defining layer 160. The second base substrate 210 may be disposed on the second electrode 180. The first mirror layer 220 may be disposed on the second base substrate 210. The second mirror layer 230 may be disposed on the second base substrate 210 on which the first mirror layer 220 is disposed.

Figure 5:
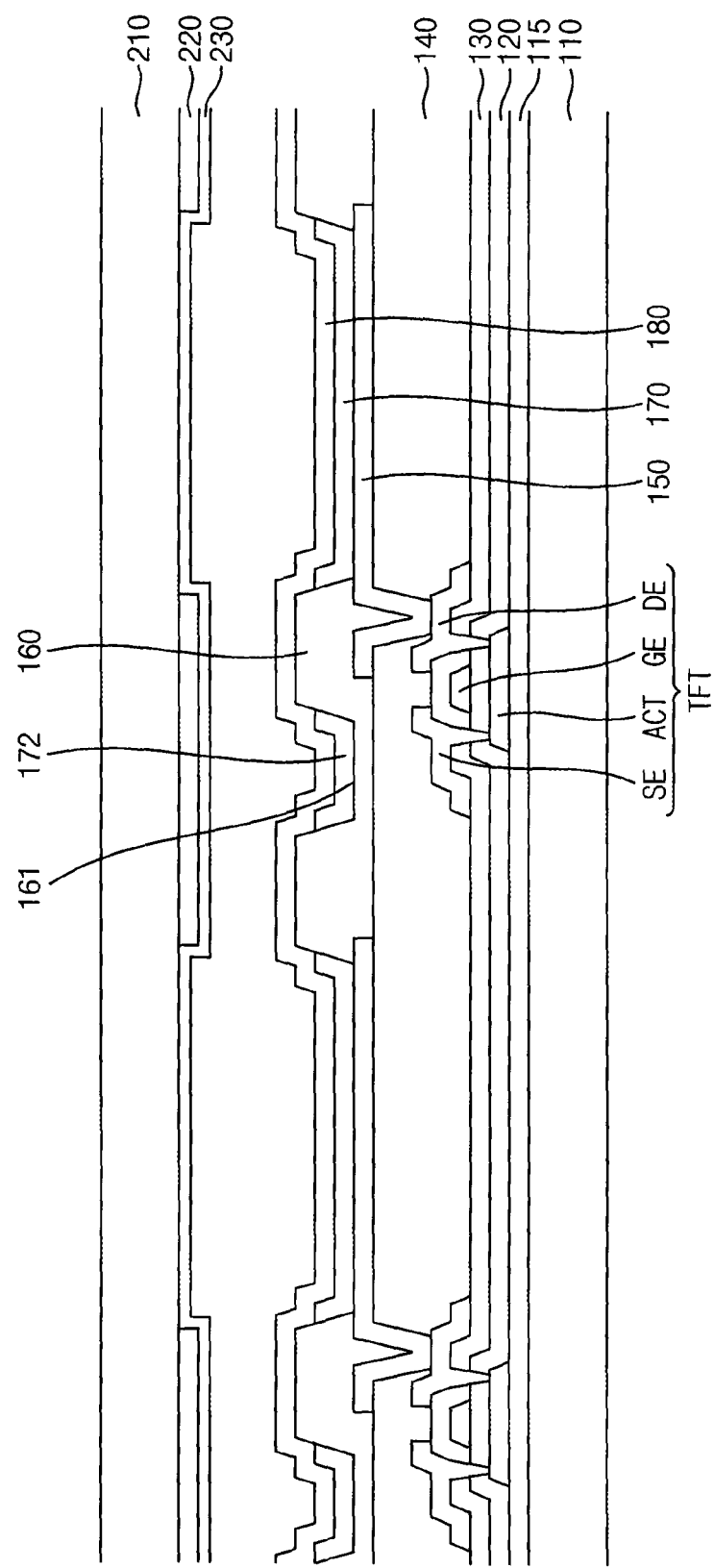
FIG. 5 is a cross-sectional view illustrating an organic light emitting display panel, according to an exemplary embodiment.

FIG. 5 is a cross-sectional view illustrating an organic light emitting display panel, according to an exemplary embodiment. The organic light emitting display panel is substantially same as the organic light emitting display panel of FIG. 4 except for a pixel defining layer 160 and a second light blocking pattern 172. Thus, detailed descriptions concerning the same elements will be briefly described or omitted.

The organic light emitting display panel may include a first base substrate 110, a buffer layer 115, a first insulation layer 120, a thin film transistor TFT, a second insulation layer 130, a planarization layer 140, a first electrode 150, a pixel defining layer 160, a light emitting structure 170, a second light blocking pattern 172, a second electrode 180, a first mirror layer 220, a second mirror layer 230, and a second base substrate 210.

The first base substrate 110 may include a transparent insulation substrate. The buffer layer 115 may be disposed on the first base substrate 110. The active pattern ACT may be disposed on the buffer layer 115. The first insulation layer 120 may be disposed on the first base substrate 110 on which the active pattern ACT is disposed. A gate pattern including a gate electrode GE may be disposed on the first insulation layer 120. The second insulation layer 130 may be disposed on the first insulation layer 120 on which the gate pattern is disposed. A data pattern including a source electrode SE and a drain electrode DE may be disposed on the second insulation layer 130. The active pattern ACT, the gate electrode GE, the source electrode SE, and the drain electrode DE may be included in the thin film transistor TFT. The planarization layer 140 may be disposed on the second insulation layer 130 on which the thin film transistor TFT is disposed. The first electrode 150 may be disposed on the planarization layer 140.

The pixel defining layer 160 may be disposed on the planarization layer 140 on which the first electrode 150 is disposed. The pixel defining layer 160 may define an opening to expose a portion of the first electrode 150. The pixel defining layer 160 may include a transparent organic material or a transparent inorganic material.

A recessed portion 161 may be formed on the pixel defining layer 160 between the first electrode 150 and a first electrode of an adjacent pixel. The second light blocking pattern 172 may be disposed in the recessed portion 161. The second light blocking pattern 172 may be disposed on a bottom surface and a side surface of the recessed portion 161. The bottom surface of the recessed portion 161 may be formed lower than an upper surface of the light emitting structure 170 so that the second light blocking pattern 172 may effectively block light. The second light blocking pattern 172 may include a material that is same as is the one included in the light blocking structure 170. In some example embodiment, the second light blocking pattern 172 may include a light-blocking material. For example, the second light blocking pattern 172 may include an organic light-blocking material.

Accordingly, although light emitted from the light emitting structure 170 passes to the adjacent pixel through the pixel defining layer 160, the light may be blocked by the second light blocking pastern 172, reflected or refracted on the light blocking pattern 172 so that the light may not pass to the adjacent pixel. Thus, mixture of lights emitting from different pixels may be decreased so that the display quality may be improved.

The light emitting structure 170 may be positioned on the first electrode 150 exposed by the opening of the pixel defining layer 160. The second electrode 180 may be disposed on the light emitting structure 170 and the pixel defining layer 160. The second base substrate 210 may be disposed on the second electrode 180. The first mirror layer 220 may be disposed on the second base substrate 210. The second mirror layer 230 may be disposed on the second base substrate 210 on which the first mirror layer 220 is disposed.

Figure 6:
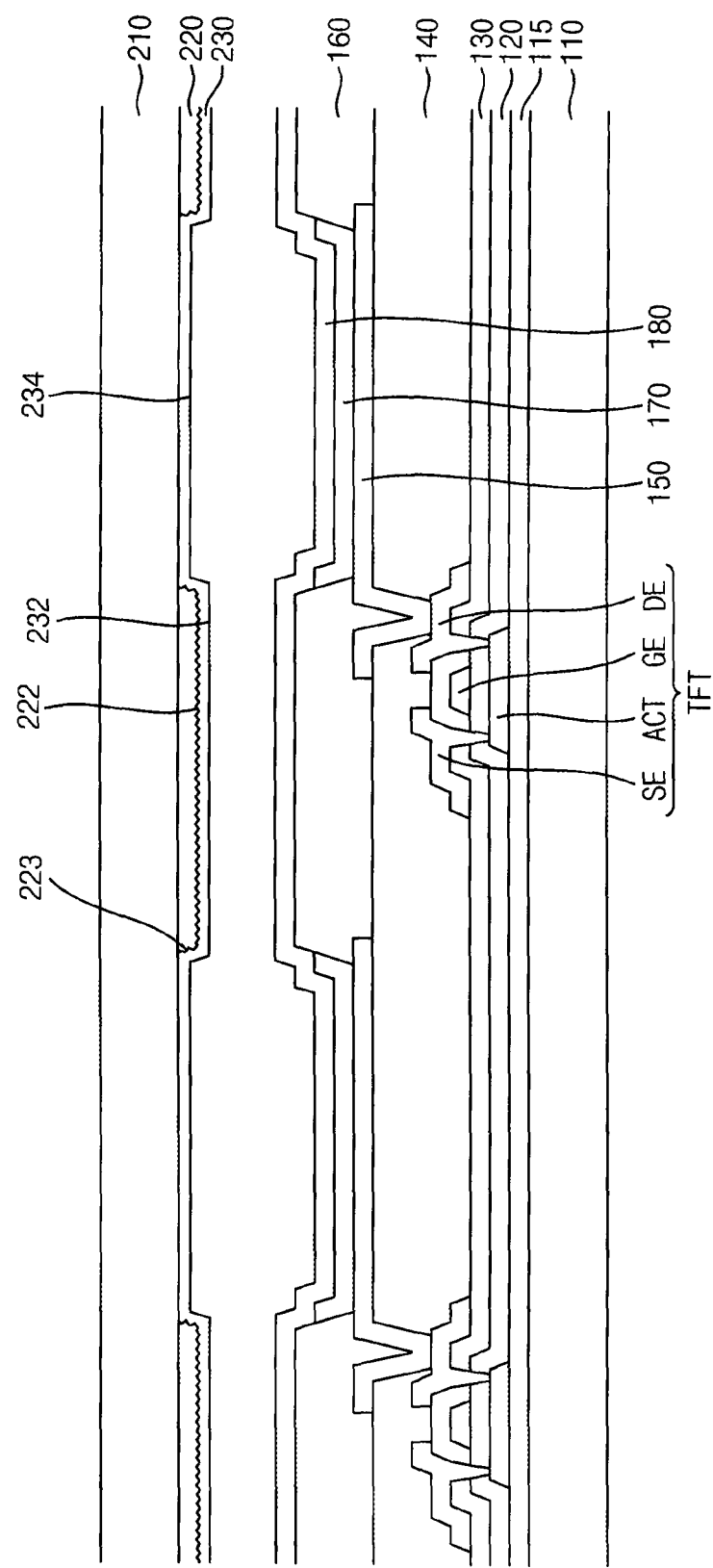
FIG. 6 is a cross-sectional view illustrating an organic light emitting display panel, according to an exemplary embodiment.

FIG. 6 is a cross-sectional view illustrating an organic light emitting display panel, according to an exemplary embodiment. The organic light emitting display panel is substantially same as the organic light emitting display panel of FIG. 1 except for a pixel defining layer 160, a first mirror layer 220 and a second mirror layer 230. Thus, detailed descriptions concerning the same elements will be briefly described or omitted.

The organic light emitting display panel includes a first base substrate 110, a buffer layer 115, a first insulation layer 120, a thin film transistor TFT, a second insulation layer 130, a planarization layer 140, a first electrode 150, a pixel defining layer 160, a light emitting structure 170, a second electrode 180, a first mirror layer 220, a second mirror layer 230, and a second base substrate 210.

The first base substrate 110 may include a transparent insulation substrate. The buffer layer 115 may be disposed on the first base substrate 110. The active pattern ACT may be disposed on the buffer layer 115. The first insulation layer 120 may be disposed on the first base substrate 110 on which the active pattern ACT is disposed. A gate pattern including a gate electrode GE may be disposed on the first insulation layer 120. The second insulation layer 130 may be disposed on the first insulation layer 120 on which the gate pattern is disposed. A data pattern including a source electrode SE and a drain electrode DE may be disposed on the second insulation layer 130. The active pattern ACT, the gate electrode GE, the source electrode SE, and the drain electrode DE may be included in the thin film transistor TFT. The planarization layer 140 may be disposed on the second insulation layer 130 on which the thin film transistor TFT is disposed. The first electrode 150 may be disposed on the planarization layer 140. The pixel defining layer 160 may be disposed on the planarization layer 140 on which the first electrode 150 is disposed.

The light emitting structure 170 may be positioned on the first electrode 150 exposed by the opening of the pixel defining layer 160. The second electrode 180 may be disposed on the light emitting structure 170 and the pixel defining layer 160. The second base substrate 210 may be disposed on the second electrode 180.

The first mirror layer 220 may be disposed on the second base substrate 210. The first mirror layer 220 may define an opening corresponding to the light emitting structure 180. The first mirror layer 220 may include a material having high reflectivity such as metal to reflect external light. For example, the first mirror layer 220 may include aluminum (Al), chrome (Cr), silver (Ag), iron (Fe), platinum (Pt), mercury (Hg), nickel (Ni), tungsten (W), vanadium (V), molybdenum (Mo), etc. In some example embodiment, the first mirror layer 220 may have a multi layer structure having a transparent conductive metal oxide layer and a metal layer. For example, the first mirror layer 220 may include ITO/Ag/ITO triple layers.

The first mirror layer 220 may include a first surface 222 that is in parallel with a surface of the second base substrate 210 and a side surface that connects the first surface 222 and the side surface 223 of the second base substrate 210. The first surface 222 and the side surface 223 may be uneven. The unevenness of the first surface and the side surface 223 may be formed by various processes such as plasma etching, imprint lithography, etc.

Accordingly, although light emitted from the light emitting structure 170 passes to the first surface 222 of the first mirror layer 220, the light may be irregularly reflected because of the unevenness of the first surface 222 so that the light may not pass to the adjacent pixel. Thus, mixture of lights emitting from different pixels may be decreased so that the display quality may be improved.

The second mirror layer 230 may be disposed on the second base substrate 210 on which the first mirror layer 220 is disposed. A second surface 232 of the second mirror layer 220 may overlap the first surface 222 of the first mirror layer 230. The second surface 232 may be even. In some example embodiment, the second surface 232 may be uneven similar to the first surface 222 of the first mirror layer 220.

Figure 7:
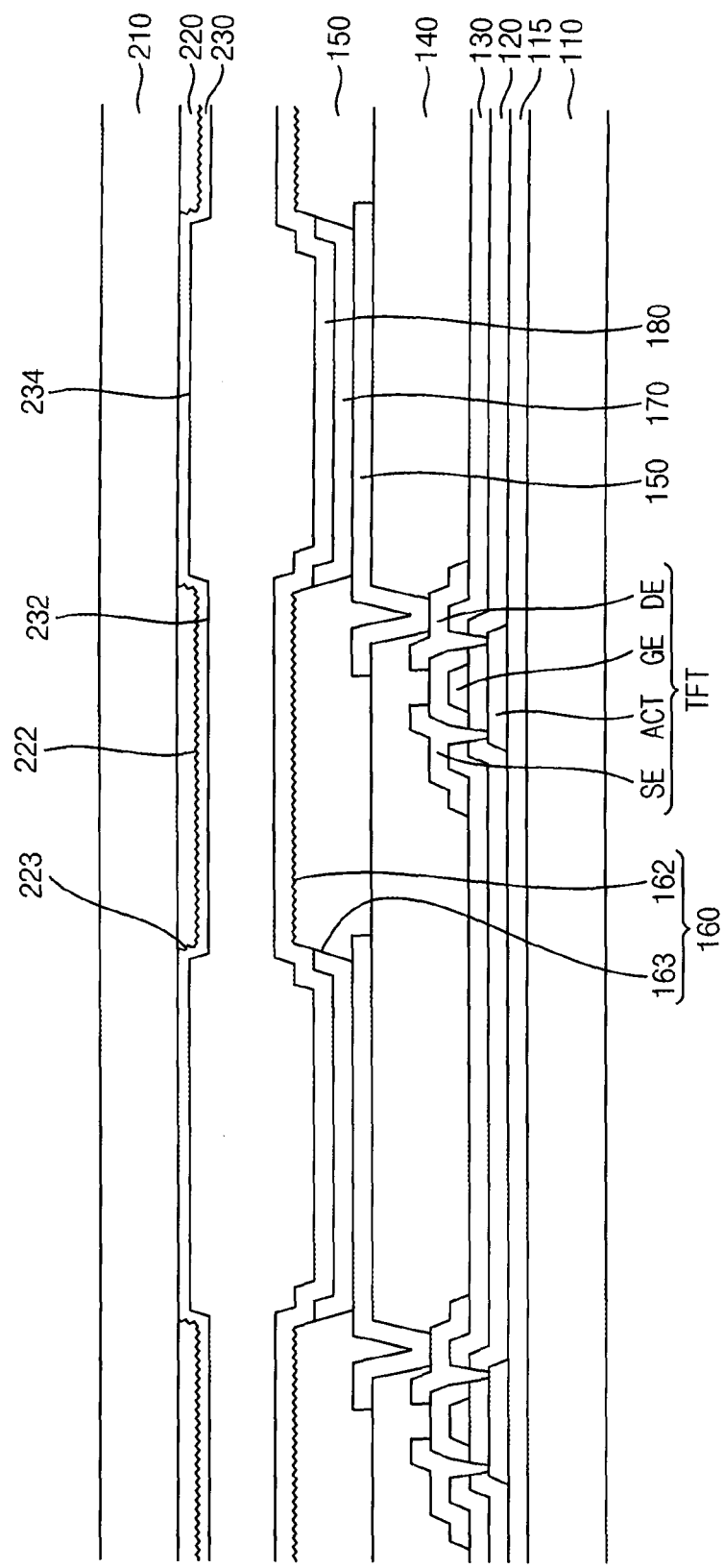
FIG. 7 is a cross-sectional view illustrating an organic light emitting display panel, according to an exemplary embodiment.

FIG. 7 is a cross-sectional view illustrating an organic light emitting display panel, according to an exemplary embodiment. The organic light emitting display panel is substantially same as the organic light emitting display panel of FIG. 6 except for a pixel defining layer 160. Thus, detailed descriptions concerning the same elements will be briefly described or omitted.

The organic light emitting display panel includes a first base substrate 110, a buffer layer 115, a first insulation layer 120, a thin film transistor TFT, a second insulation layer 130, a planarization layer 140, a first electrode 150, a pixel defining layer 160, a light emitting structure 170, a second electrode 180, a first mirror layer 220, a second mirror layer 230, and a second base substrate 210.

The first base substrate 110 may include a transparent insulation substrate. The buffer layer 115 may be disposed on the first base substrate 110. The active pattern ACT may be disposed on the buffer layer 115. The first insulation layer 120 may be disposed on the first base substrate 110 on which the active pattern ACT is disposed. A gate pattern including a gate electrode GE may be disposed on the first insulation layer 120. The second insulation layer 130 may be disposed on the first insulation layer 120 on which the gate pattern is disposed. A data pattern including a source electrode SE and a drain electrode DE may be disposed on the second insulation layer 130. The active pattern ACT, the gate electrode GE, the source electrode SE, and the drain electrode DE may be included in the thin film transistor TFT. The planarization layer 140 may be disposed on the second insulation layer 130 on which the thin film transistor TFT is disposed. The first electrode 150 may be disposed on the planarization layer 140.

The pixel defining layer 160 may be disposed on the planarization layer 140 on which the first electrode 150 is formed. The pixel defining layer 160 may define an opening to expose a portion of the first electrode 150. The pixel defining layer 160 may include a transparent organic material or a transparent inorganic material. For example, the pixel defining layer 160 may be formed using photoresist, acryl-based resin, polyacryl-based resin, polyimide-based resin, a silicon compound, etc.

The pixel defining layer 160 may include an upper surface 162 that is in parallel with a surface of the first base substrate 110 and a side surface 163 that is connected to the upper surface 162. The upper surface 162 may be uneven. The unevenness of the upper surface 162 may be formed by various processes such as plasma etching, imprint lithography, etc. The side surface 163 may be flat and even. The side surface 163 that make contact to the light emitting structure 170 is flat and even so that surface condition of the side surface 163 may not affect the property of the light emitting structure 170.

Accordingly, although light emitted from the light emitting structure 170 passes to the adjacent pixel through the pixel defining layer 160, the light may be irregularly reflected because of the unevenness of the upper surface 162 so that the light may not pass to the adjacent pixel. Thus, mixture of lights emitting from different pixels may be decreased so that the display quality may be improved.

The light emitting structure 170 may be positioned on the first electrode 150 exposed by the opening of the pixel defining layer 160. The second electrode 180 may be disposed on the light emitting structure 170 and the pixel defining layer 160. The second base substrate 210 may be disposed on the second electrode 180.

The first mirror layer 220 may include a first surface 222 that is in parallel with a surface of the second base substrate 210 and a side surface that connects the first surface 222 and the side surface 223 of the second base substrate 210. The first surface and the side surface may be uneven. The second mirror layer 230 may be disposed on the second base substrate 210 on which the first mirror layer 220 is disposed. A second surface 232 of the second mirror layer 220 may overlap the first surface 222 of the first mirror layer 230. The second surface 232 may be even.

Figure 8:
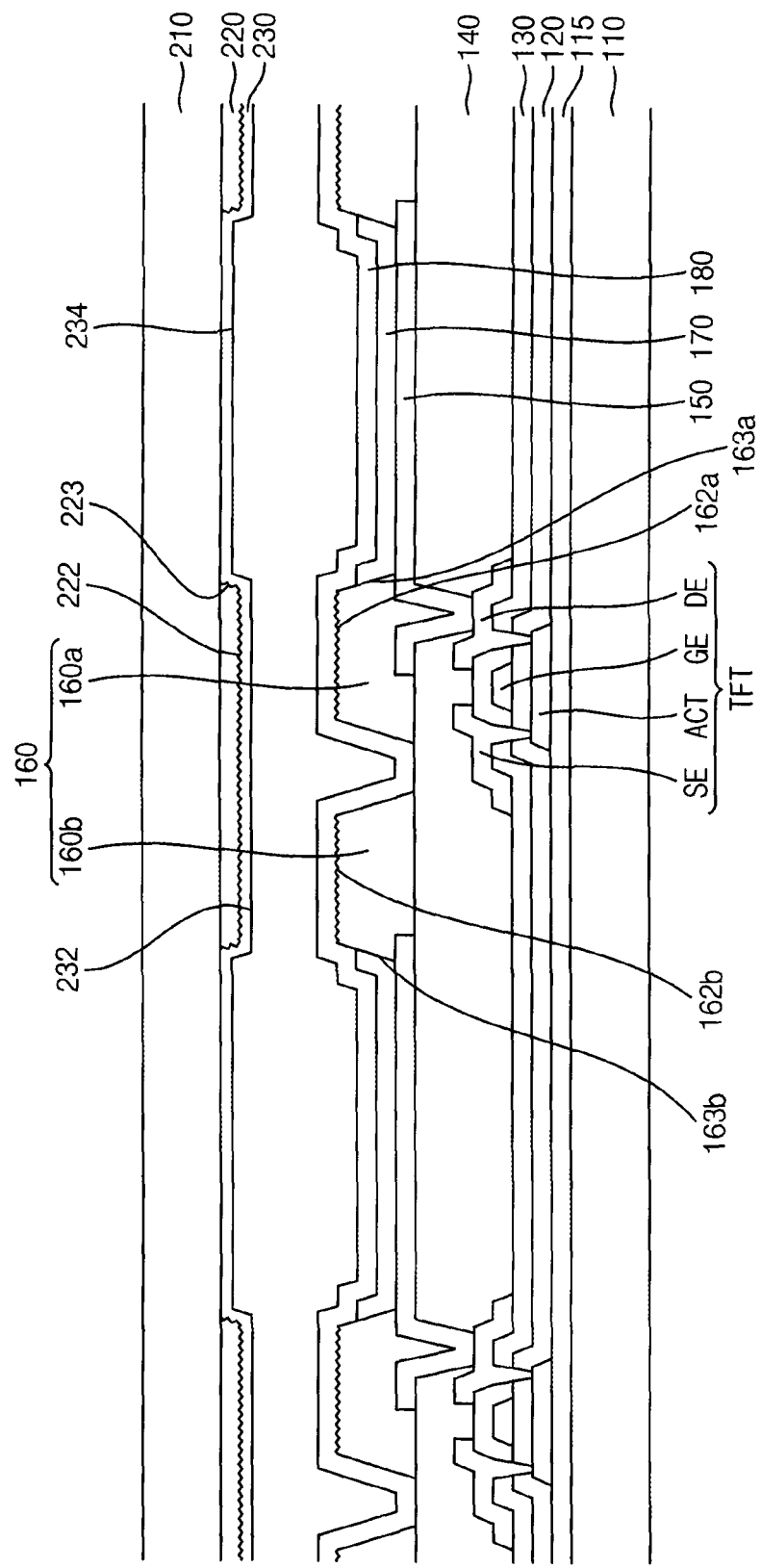
FIG. 8 is a cross-sectional view illustrating an organic light emitting display panel, according to an exemplary embodiment.

FIG. 8 is a cross-sectional view illustrating an organic light emitting display panel, according to an exemplary embodiment. The organic light emitting display panel is substantially same as the organic light emitting display panel of FIG. 7 except for a pixel defining layer 160. Thus, detailed descriptions concerning the same elements will be briefly described or omitted.

The organic light emitting display panel includes a first base substrate 110, a buffer layer 115, a first insulation layer 120, a thin film transistor TFT, a second insulation layer 130, a planarization layer 140, a first electrode 150, a pixel defining layer 160, a light emitting structure 170, a second electrode 180, a first mirror layer 220, a second mirror layer 230, and a second base substrate 210.

The first base substrate 110 may include a transparent insulation substrate. The buffer layer 115 may be disposed on the first base substrate 110. The active pattern ACT may be disposed on the buffer layer 115. The first insulation layer 120 may be disposed on the first base substrate 110 on which the active pattern ACT is disposed. A gate pattern including a gate electrode GE may be disposed on the first insulation layer 120. The second insulation layer 130 may be disposed on the first insulation layer 120 on which the gate pattern is disposed. A data pattern including a source electrode SE and a drain electrode DE may be disposed on the second insulation layer 130. The active pattern ACT, the gate electrode GE, the source electrode SE, and the drain electrode DE may be included in the thin film transistor TFT. The planarization layer 140 may be disposed on the second insulation layer 130 on which e thin film transistor TFT is disposed. The first electrode 150 may be disposed on the planarization layer 140.

The pixel defining layer 160 may be disposed on the planarization layer 140 on which the first electrode 150 is formed. The pixel defining layer 160 may define an opening to expose a portion of the first electrode 150. The pixel defining layer 160 may include a transparent organic material or a transparent inorganic material. For example, the pixel defining layer 160 may be formed using photoresist, acryl-based resin, polyacryl-based resin, polyimide-based resin, a silicon compound, etc.

The pixel defining layer 160 may include a first portion 160a and a second portion 160b. The first portion 160a may make contact with the first electrode 150. The second portion 160b may make contact with a first electrode of an adjacent pixel. The first portion 160a and the second portion 160b may be spaced apart from each other in a cross-sectional view.

The first portion 160a may include a first upper surface 162a that is in parallel with a surface of the first base substrate 110 and a first side surface 163a that is connected to the first upper surface 162a. The first upper surface 162a may be uneven. The unevenness of the first upper surface 162a may be formed by various processes such as plasma etching, imprint lithography, etc. The first side surface 163a may be flat and even.

The second portion 160b may include a second upper surface 162b that is in parallel with a surface of the first base substrate 110 and a second side surface 163b that is connected to the second upper surface 162b. The second upper surface 162b may be uneven. The unevenness of the second upper surface 162b may be formed by various processes such as plasma etching, imprint lithography, etc. The second side surface 163b may be flat and even. The first side surface 163a and the second side surface 163b that make contact to the light emitting structure 170 are flat and even so that surface condition of the first and second side surface 163a and 163b may not affect the property of the light emitting structure 170.

Accordingly, although light emitted from the tight emitting structure 170 passes to the adjacent pixel through the pixel defining layer 160, the light may be irregularly reflected because of the unevenness or reflected or reflected on a pixel defining layer 160 between the first portion 160a and the second portion 160b so that the light may not pass to the adjacent pixel. Thus, mixture of lights emitting from different pixels may be decreased so that the display quality may be improved.

Figure 9A:
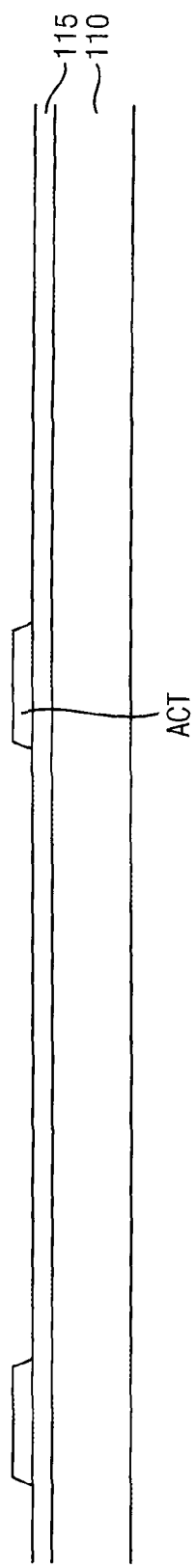

FIGS. 9A to 9J are cross-sectional views illustrating a method of manufacturing the organic light emitting display panel of FIG. 8. Referring to FIG. 9A, a buffer layer 115 may be formed on a first base substrate 110. The buffer layer 115 may be formed by a spin coating process, a chemical vapor deposition (CVD) process, a plasma enhanced chemical vapor deposition (PECVD) process, a high density plasma-chemical vapor deposition (HDP-CVD) process, a printing process, etc.

An active pattern ACT may be formed on the buffer layer 115. A semiconductor layer (not illustrated) may be formed on the buffer layer 115, and then a preliminary active layer (not illustrated) may be formed on the buffer layer 115 by patterning the semiconductor layer. The crystallization process may be performed in the vicinity of the preliminary active layer to form the active pattern ACT on the buffer layer 115. The semiconductor layer may be formed by a CVD process, a PECVD process, a low pressure chemical vapor deposition (LPCVD) process, a sputtering process, a printing process, etc. When the semiconductor layer includes amorphous silicon, the active pattern ACT may include polysilicon. The crystallization process for forming the active pattern ACT may include a laser irradiation process, a thermal treatment process, a thermal process utilizing a catalyst, etc. In some example embodiments, a dehydrogenation process may be performed in the vicinity of the semiconductor layer and/or the preliminary active layer after forming the semiconductor layer and/or the preliminary active layer on the buffer layer 115. The dehydrogenation process may reduce the hydrogen concentration of the semiconductor layer and/or the preliminary active layer so that the active pattern ACT may have improved electrical characteristics.

Figure 9B:
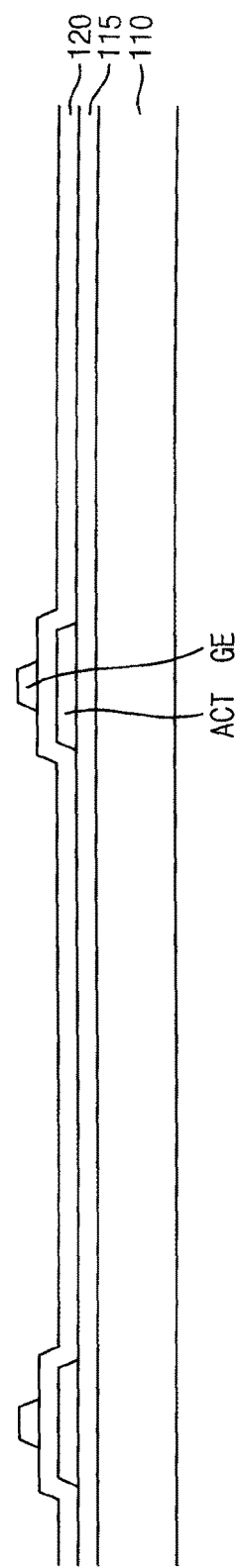

Referring to FIG. 9B, a first insulation layer 120 may be formed on the buffer layer 115 on which the active pattern ACT is formed. The first insulation layer 120 may be formed by a CVD process, a spin coating process, a PECVD process, a sputtering process, a vacuum evaporation process, an HDP-CVD process, a printing process, etc. A gate pattern that includes a gate electrode GE may be formed on the first insulation layer 120. In example embodiments, a first conductive layer (not illustrated) may be formed on the first insulation layer 120, and then the first conductive layer may be partially etched by a photolithography process or an etching process using an additional etching mask. Hence, the gate pattern GP may be provided on the first insulation layer 120.

Figure 9C:
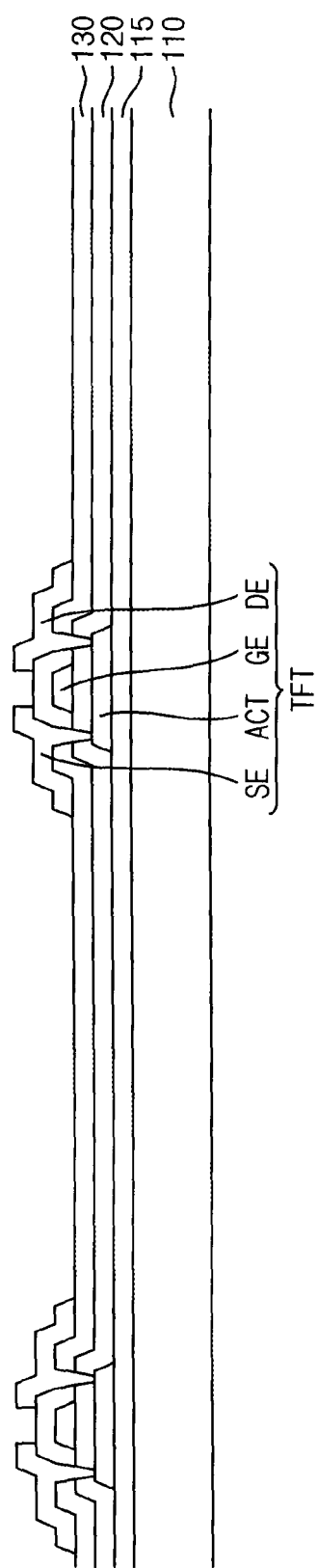

Referring to FIG. 9C, a second insulation layer 130 may be formed on the first insulation layer 120 on which the gate pattern is formed. The second insulation layer 130 may be formed by a CVD process, a spin coating process, a PECVD process, a sputtering process, a vacuum evaporation process, an HDP-CVD process, a printing process, etc. A data pattern including a source electrode SE and a drain electrode DE may be formed on the second insulation layer 130. Contact holes exposing the active pattern ACT may be formed by partially etching the second insulation layer 130 and the first insulation layer 120. A second conductive layer (not illustrated) may be formed on the second insulation layer 130 to fill the contact holes, and then the data pattern may be formed by patterning the second conductive layer.

Figure 9D:
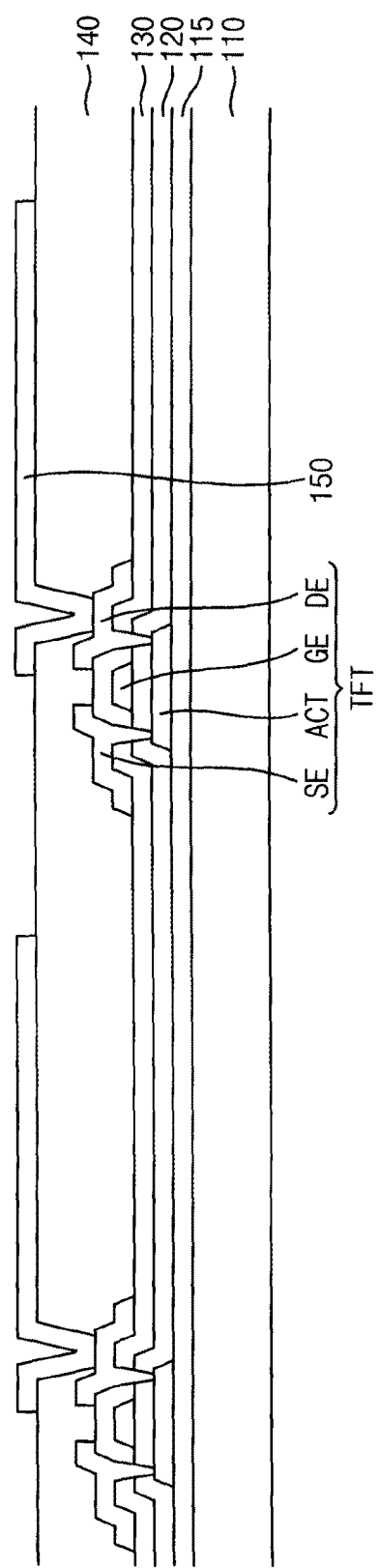

Referring to FIG. 9D, a planarization layer 140 may be formed on the second insulation layer 130 on which the data pattern is formed. The planarization layer 140 may be obtained by a spin coating process, a printing process, a sputtering process, a CVD process, an ALD process, a PECVD process, an HDP-CVD process, or a vacuum evaporation process in accordance with ingredients included in the planarization layer 140.

In example embodiments, a planarization process may be executed on planarization layer 140 to enhance the flatness of the planarization layer 140. For example, the planarization layer 140 may have a substantially leveled surface by a chemical mechanical polishing (CMP) process, an etch-back process, etc.

A first electrode 150 may be formed on the planarization layer 140. The planarization layer 140 may be partially etched by a photolithography process or an etching process using an additional mask to form a contact hole that exposes the drain electrode DE of the thin film transistor TFT through the planarization layer 140.

In example embodiments, the contact hole may have a sidewall inclined by a predetermined angle relative to the first base substrate 110. For example, the contact hole may have an upper width substantially larger than a lower width thereof.

The first electrode 150 may be formed on the planarization layer 140 to fill the contact hole. The first electrode 150 may make contact with the drain electrode DE through the contact hole. For example, a pixel electrode layer may be formed on the planarization layer 140, and then the pixel electrode layer may be partially etched by a photolithography process or an etching process using an additional mask. Hence, the first electrode 150 may be formed. The pixel electrode layer may be formed by a printing process, a sputtering process, a CVD process, a PLD process, a vacuum evaporation process, an ALD process, etc.

Figure 9E:
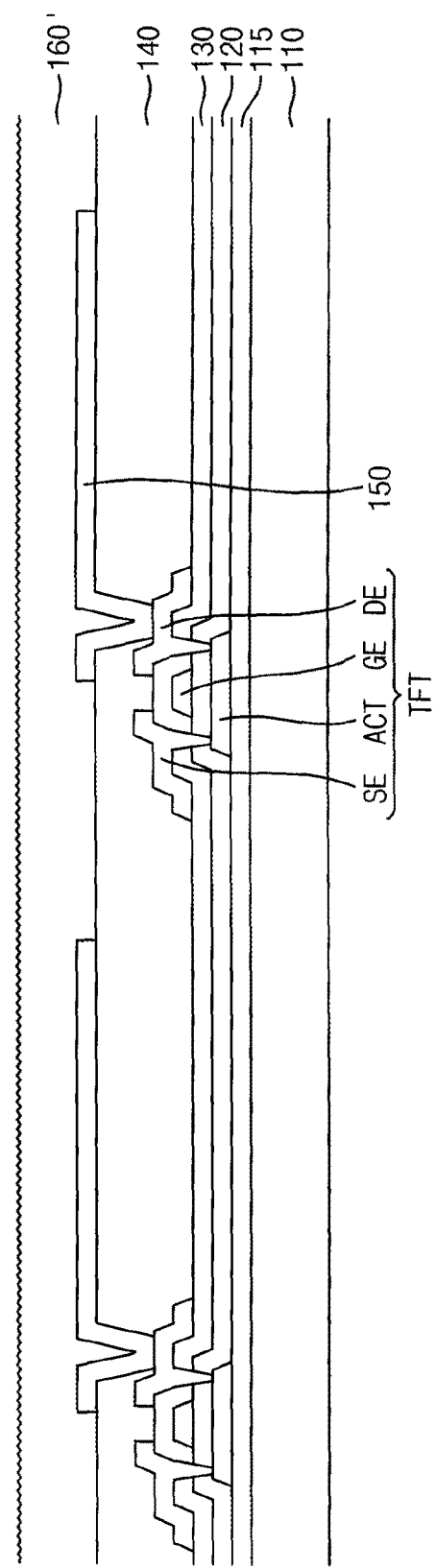

Referring to FIG. 9E, a preliminary pixel defining layer 160' may be formed on the planarization layer 140 on which the first electrode 160 is formed. The preliminary pixel defining layer 160' may be formed by a spin coating process, a spray process, a printing process, a CVD process, etc. An upper surface of the preliminary pixel defining layer 160' may be even. The unevenness may be formed by various processes such as rubbing, sand blast, plasma etching, imprint lithography, etc., in accordance with the property of the preliminary pixel defining layer 160'.

Figure 9F:
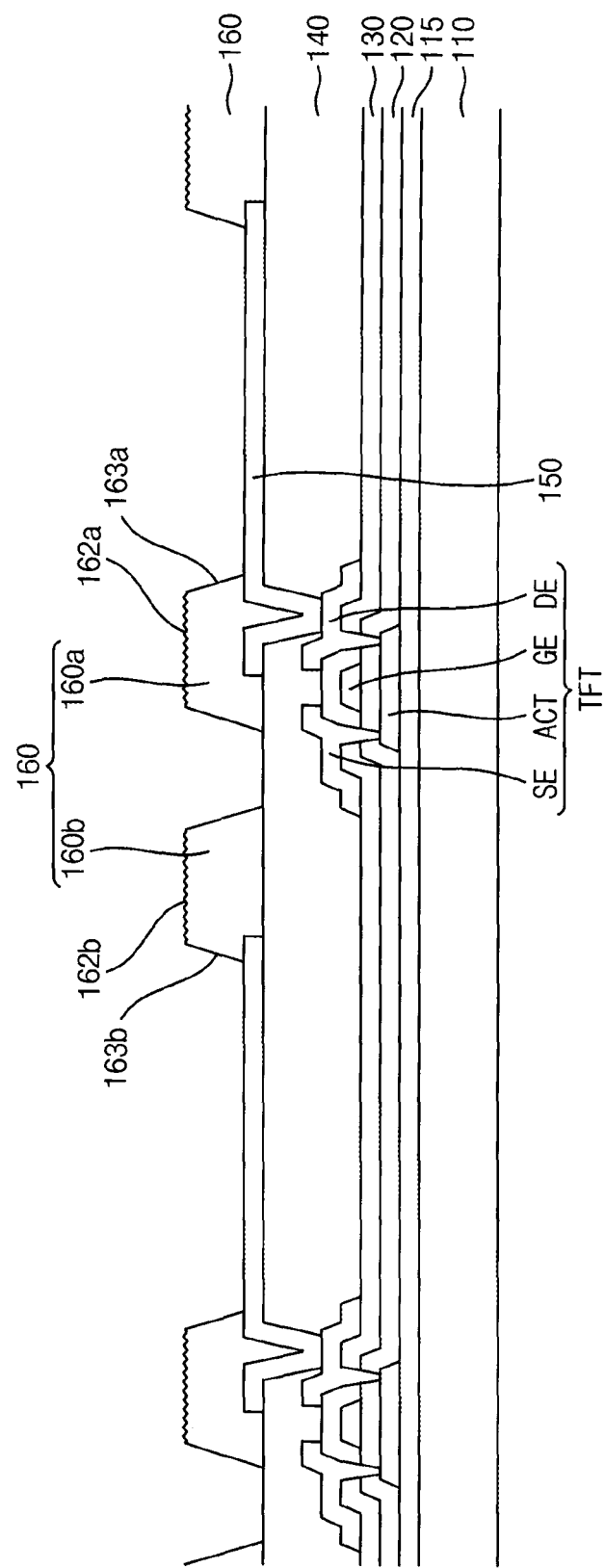

Referring to FIG. 9F, a pixel defining layer 160 may be formed by patterning the preliminary pixel defining layer 160'. The pixel defining layer 160 may include a first portion 160a and a second portion 160b. The first portion 160a may make contact with a first electrode of an adjacent pixel. The first portion 160a and the second portion 160b may be spaced apart from each other in across-sectional view. The unevenness is formed on the upper surface of the preliminary pixel defining layer 160' before forming the pixel defining layer 160 so that first upper surface 162a of the first portion 160a is uneven, and a first side surface 163a of the first portion 160a is even. In addition, and a second upper surface 162b of the second portion 160b are uneven, and a second side surface 163b of the second portion 160b is even.

Figure 9G:
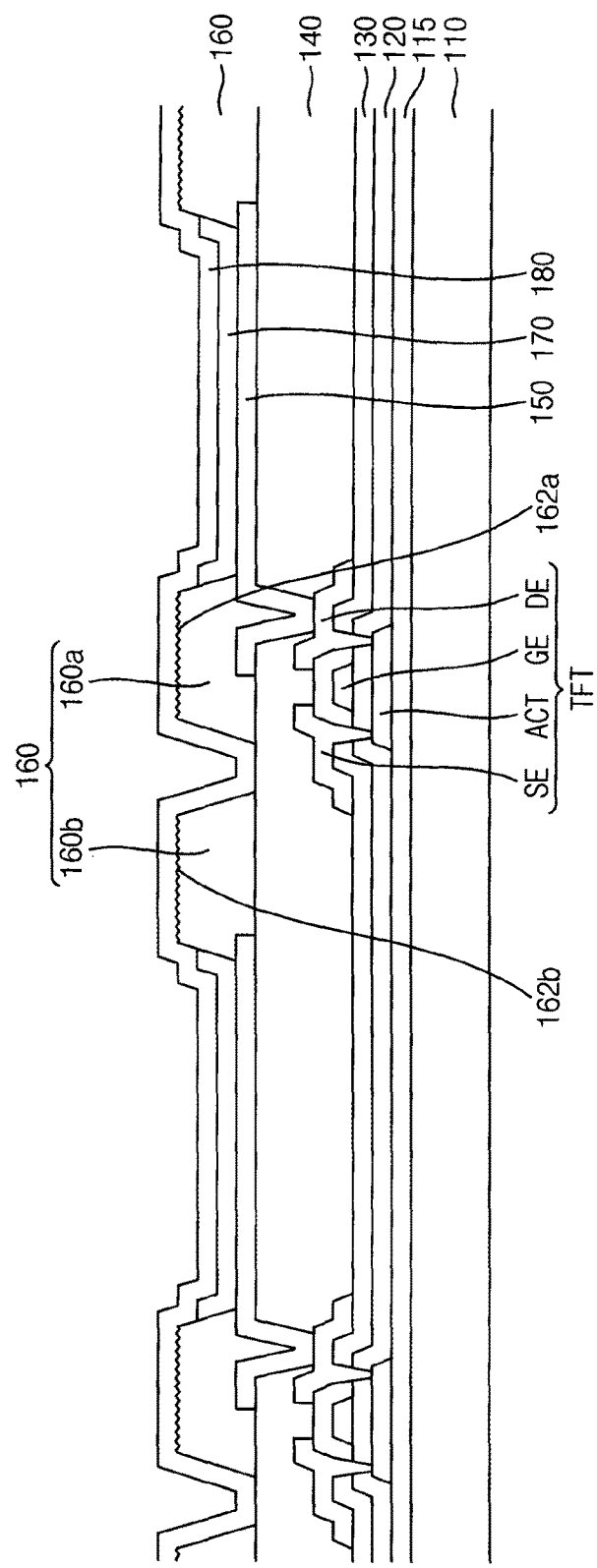

Referring to FIG. 9G, alight emitting structure 170 may be formed on the first electrode 150. The light emitting structure 170 may be formed by a laser-induced thermal imaging process, a printing process, etc. A second electrode 180 may be formed on the light emitting structure 170 and the pixel defining layer 160. The second electrode 180 may be formed by a printing process, a sputtering process, a CVD process, a PLD process, a vacuum evaporation process, an ALD process, etc. A portion of second electrode 180 that covers the unevenness of the pixel defining layer 160 may have a flat and even upper surface. In some example embodiment, the portion of second electrode 180 that covers the unevenness of the pixel defining layer 160 may have an uneven upper surface due to the unevenness of the pixel defining layer 160.

Figure 9H:
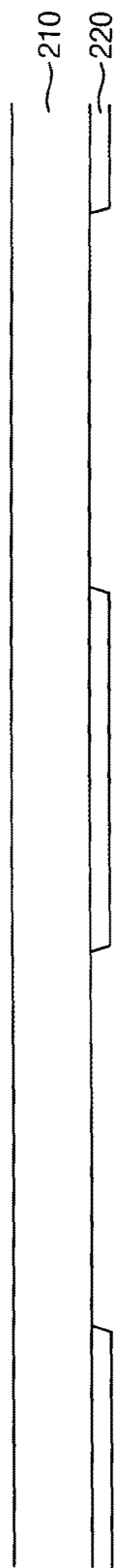
Figure 91:
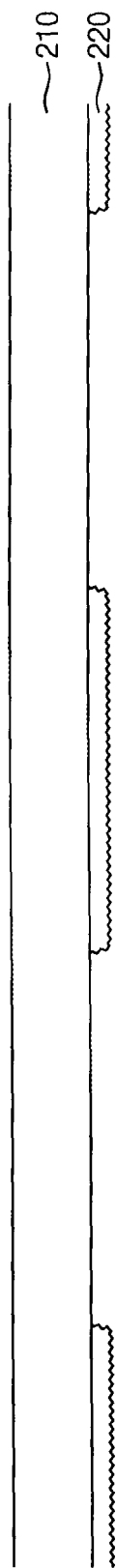

Referring to FIG. 9H, a first mirror layer 220 that defines an opening may be formed on a second base substrate 210. A metal layer may be formed on the second base substrate 210, and then the metal layer may be partially etched by a photolithography process or an etching process using an additional mask. Hence, the first mirror layer 220 may be formed.

Referring to FIG. 9I, the first mirror layer 220 may be uneven. The first mirror layer 220 may include a first surface 222 that is in parallel with a surface of the second base substrate 210 and a side surface that connects the first surface 222 and the side surface 223 of the second base substrate 210. The unevenness may be formed on the first surface 222 and the side surface 223. The unevenness may be formed by various processes such as rubbing, sand blast, plasma etching, imprint lithography, etc. in accordance with the property of the first mirror layer 220.

Referring to FIG. 9J, a second mirror layer 230 may be formed on the first mirror layer 220 and the second base substrate 210. The second mirror layer 230 may entirely cover the first mirror layer 230 and a portion of second base substrate 210 that is exposed by the openings of the first mirror layer 230. A portion of the second mirror layer 230 that covers the unevenness of the first mirror layer 220 may have a flat and even surface. In some example embodiment, the portion of the second mirror layer 230 that covers the unevenness of the first mirror layer 220 may have an uneven surface due to the unevenness of the first mirror layer 220. The organic light emitting display panel may be formed by locating the second substrate 210 on which the first mirror layer 220 and the second mirror layer 230 to face the first base substrate 110 on which the second electrode 180 is formed.

Figure 10A:
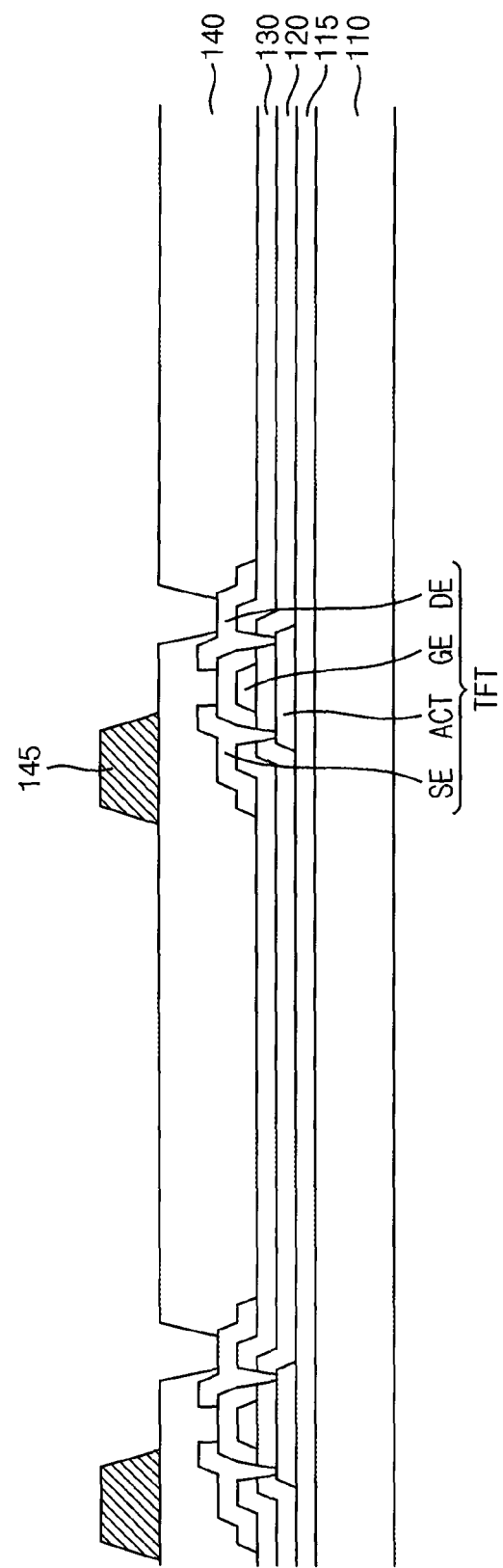
FIGS. 10A to 10D are cross-sectional views illustrating a method of manufacturing the organic light emitting display panel of FIG. 2.

FIGS. 10A to 10D are cross-sectional views illustrating a method of manufacturing the organic light emitting display panel of FIG. 2. Referring to FIG. 10A, a buffer layer 115 may be formed on a first base substrate 110. An active pattern ACT may be formed on the buffer layer 115. A first insulation layer 120 may be formed on the buffer layer 115 on which the active pattern ACT is formed. A gate pattern that includes a gate electrode GE may be formed on the first insulation layer 120. A second insulation layer of 130 may be formed on the first insulation layer 120 on which the gate pattern is formed. A data pattern including a source electrode SE and a drain electrode DE maw be formed on the second insulation layer 130. A planarization layer 140 may be formed on the second insulation layer 130 on the data pattern is formed.

A first light blocking pattern 145 may be formed on the second insulation layer 130. The first light blocking pattern 145 may be disposed between a first electrode (150 of FIG. 10B) and a first electrode of an adjacent pixel. The first light blocking pattern 145 may include a light-blocking material. For example, the first light blocking pattern 145 may include metal, metal oxide, organic material, inorganic material, etc. For example, a metal layer may be formed on the planarization layer 140, and then the metal layer may be partially etched by a photolithography process or an etching process using an additional mask. Hence, the first light blocking pattern 145 may be obtained.

Figure 10B:
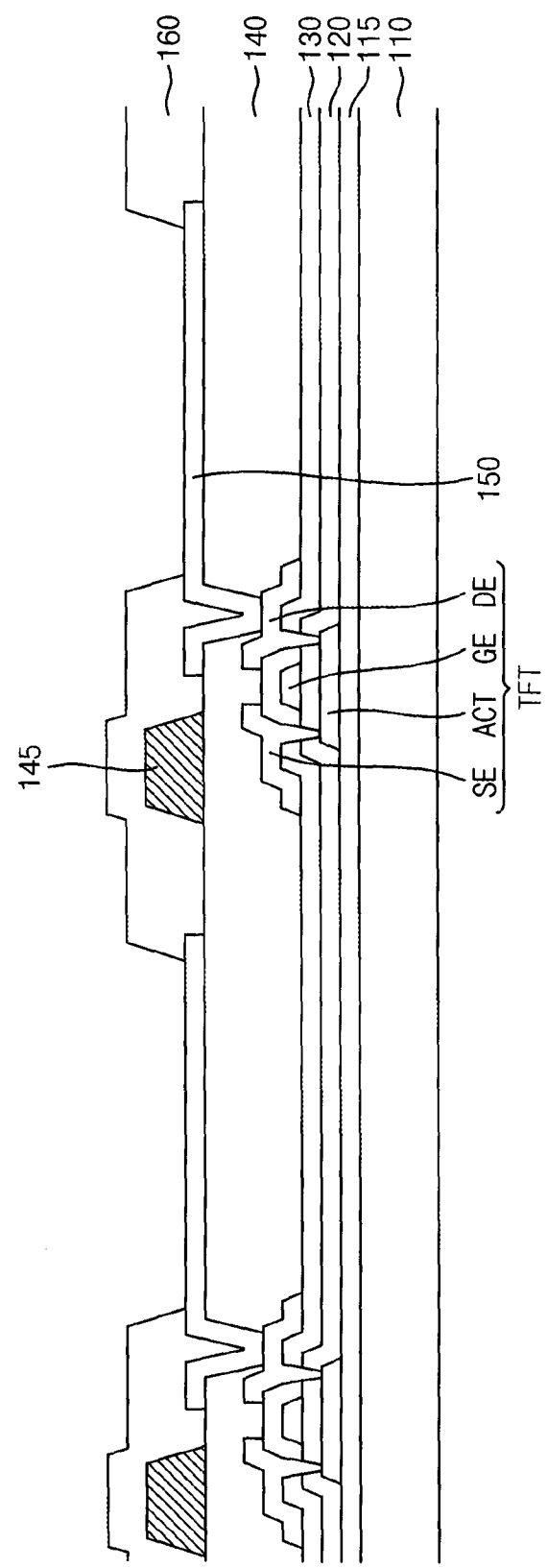

Referring to FIG. 10B, a first electrode 150 may be formed on the planarization layer 140 on which the first light blocking pattern 145 is formed. A pixel electrode layer may be formed on the planarization layer 140, and then the pixel electrode layer may be partially etched by a photolithography process or an etching process using an additional mask. Hence, the first electrode 150 may be formed.

A pixel defining layer 160 may be formed on the planarization layer 140 on which the first light blocking pattern 145 and the first electrode 150 are formed. The pixel defining layer 160 may be formed by a spin coating process, a spray process, a printing process, a CVD process, etc. In some example embodiment, an opening that exposes a portion of the first electrode 150 may be formed by etching the pixel defining layer 160.

Figure 10C:
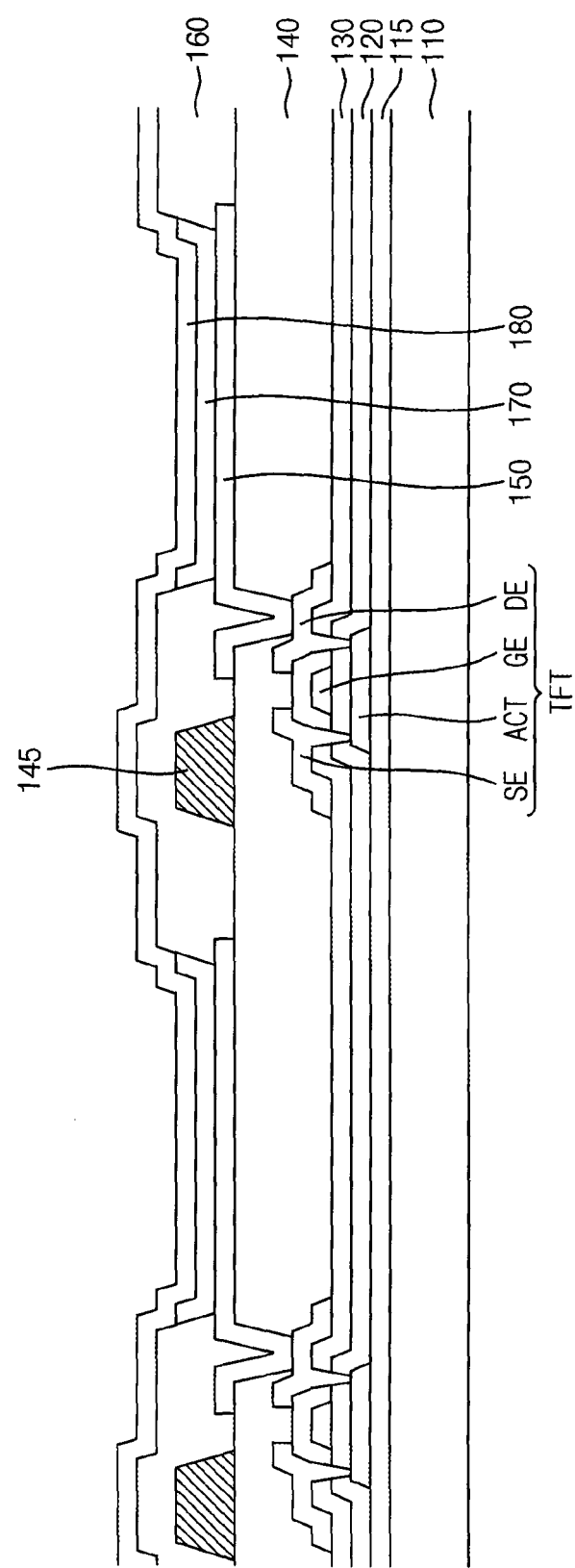

Referring to FIG. 10C, a light emitting structure 170 may be formed on the first electrode 150. The light emitting structure 170 may be formed by a laser-induced thermal imaging process, a printing process, etc. A second electrode 180 may be formed on the light emitting structure 170 and the pixel defining layer 160. The second electrode 180 may be formed by a printing process, a sputtering process, a CVD process, a PLD process, a vacuum evaporation process, an ALD process, etc.

Figure 10D:
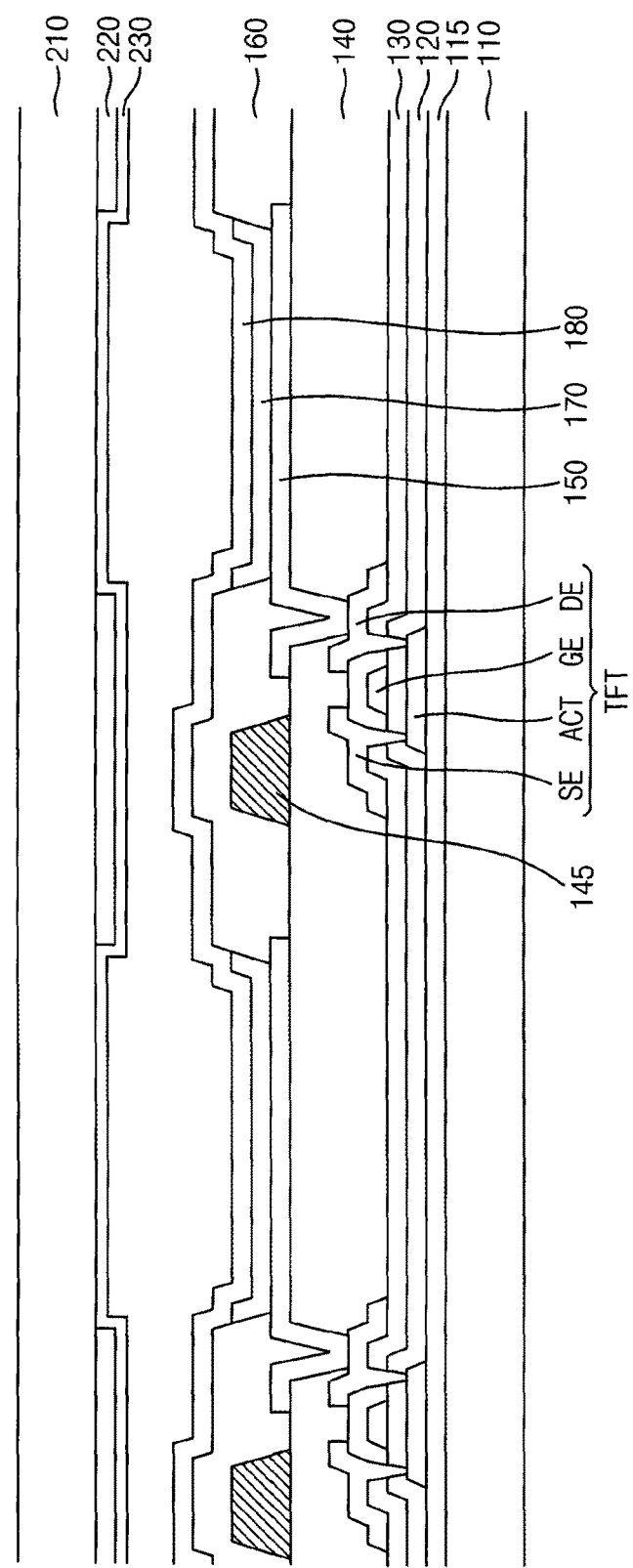

Referring to FIG. 10D, a first mirror layer 220 and a second mirror layer 230 may be formed on a second base substrate 210. The organic light emitting display panel may be formed by locating the second substrate 210 on which the first mirror layer 220 and the second mirror layer 230 to face the first base substrate 110 on which the second electrode 180 is formed.

Figure 11A:
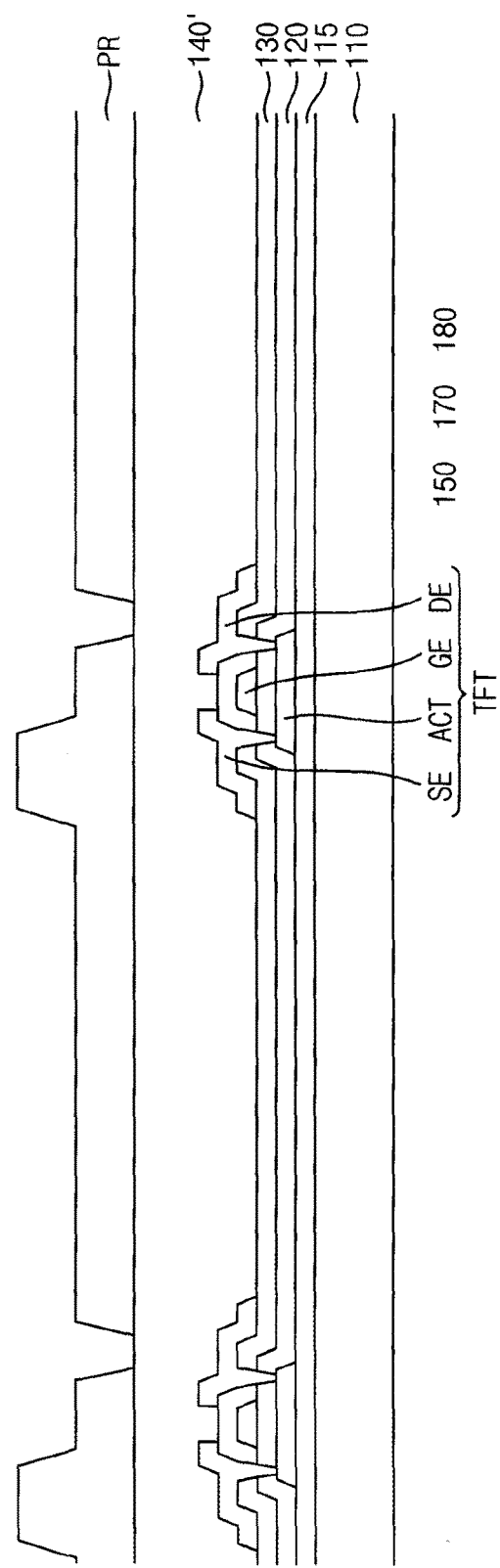
FIGS. 11A to 11E are cross-sectional views illustrating a method of manufacturing the organic light emitting display panel of FIG. 3.

FIGS. 11A to 11E are cross-sectional views illustrating a method of manufacturing the organic light emitting display panel of FIG. 3. Referring to FIG. 11A, a buffer layer 115 may be formed on a first base substrate 110. An active pattern ACT may be formed on the buffer layer 115. A first insulation layer 120 may be formed on the buffer layer 115 on which the active pattern ACT is formed. A gate pattern that includes a gate electrode GE may be formed on the first insulation layer 120. A second insulation layer 130 may be formed on the first insulation layer 120 on which the gate pattern is formed. A data pattern including a source electrode SE and a drain electrode DE may be formed on the second insulation layer 130.

A preliminary planarization layer 140' may be formed on the second insulation layer 130 on which the data pattern is formed. The preliminary planarization layer 140' may be formed by a spin coating process, a printing process, a sputtering process, a CVD process, an ALD process, a PECVD process, an HDP-CVD process, or a vacuum evaporation process, in accordance with ingredients included in the preliminary planarization layer 140'.

A photoresist pattern PR may be formed on the preliminary planarization layer 140'. A photoresist layer may be formed on the preliminary planarization layer 140' and then the photoresist layer may be patterned into the photoresist pattern PR via a photolithography process using a photo mask such as a halftone mask, a slit mask, etc.

Figure 11B:
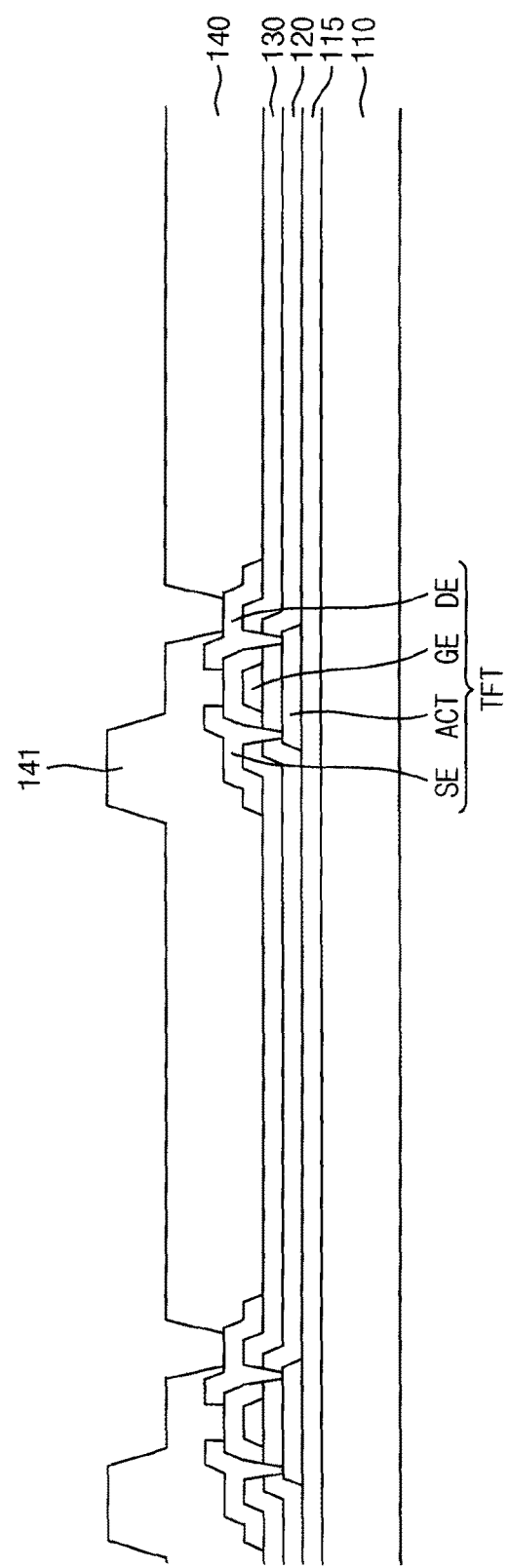

Referring to FIG. 11B, the preliminary planarization layer 140' may be patterned into a planarization layer 140 using the photoresist pattern PR. For example, the preliminary planarization layer 140' may be dr y etched using the photoresist pattern PR as an etch barrier. Accordingly, the planarization layer 140 that defines an opening exposing the drain electrode and includes a light blocking portion 141 may be formed.

Figure 11C:
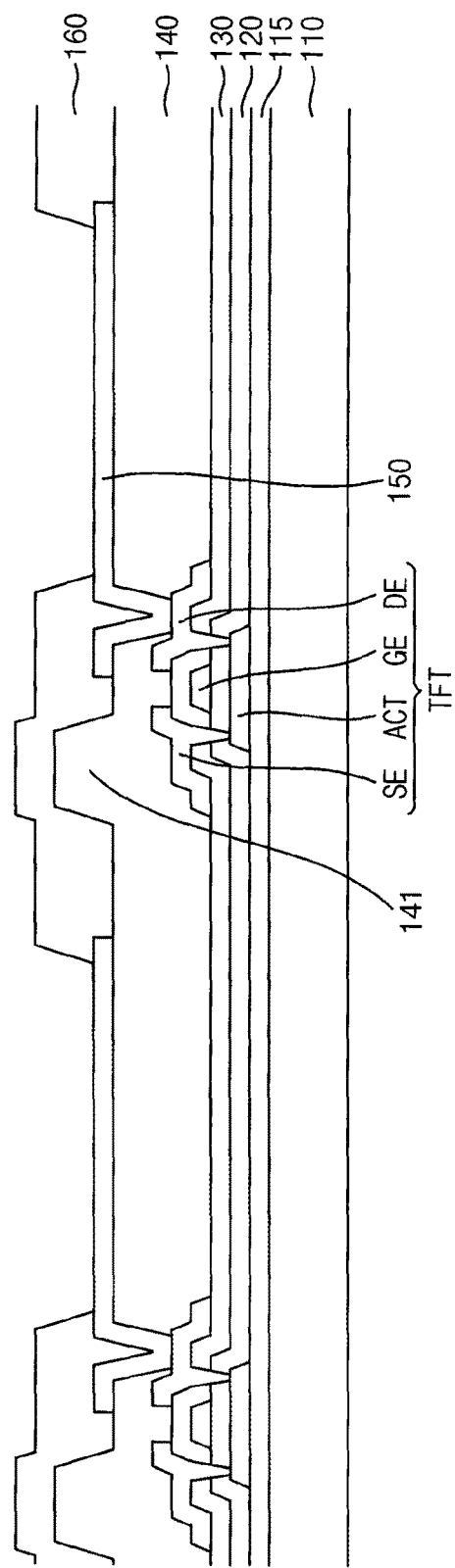

Referring to FIG. 11C, a pixel defining layer 160 may be formed on the planarization layer 140 on which the first electrode 150 is formed. The pixel defining layer 160 may be formed by a spin coating process, a spray process, a printing process, a CVD process, etc. In some example embodiment, an opening that exposes a portion of the first electrode 150 may be formed by etching the pixel defining layer 160.

Figure 11D:
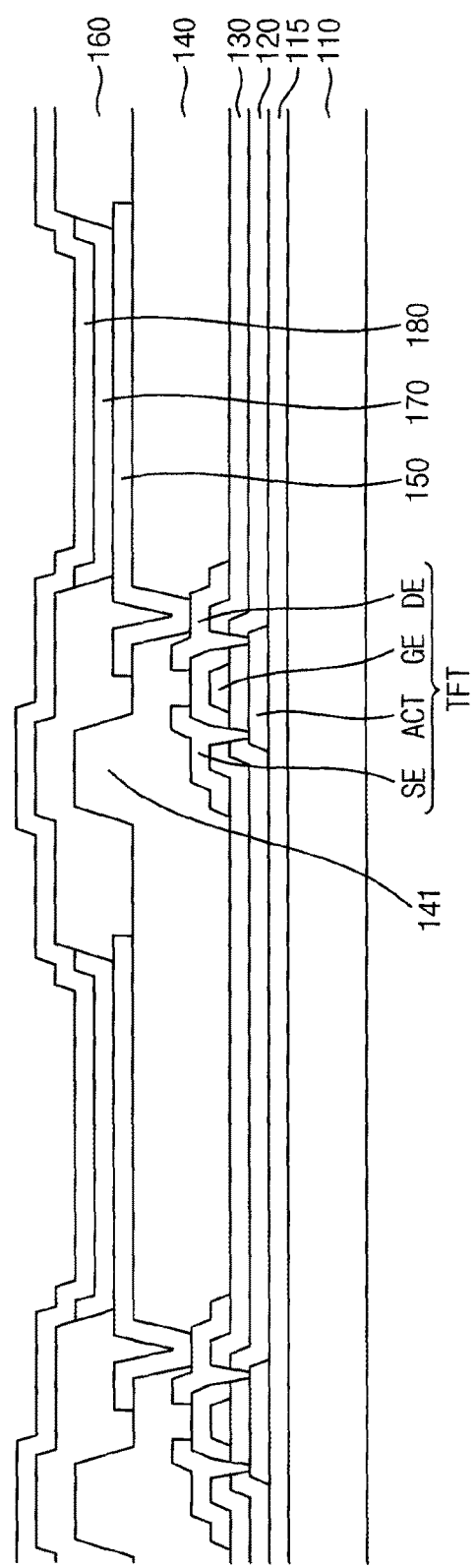

Referring to FIG. 11D, a light emitting structure 170 may be formed on the first electrode 150. The light emitting structure 170 may be formed by a laser-induced thermal imaging process, a printing process, etc. A second electrode 180 may be formed on the light emitting structure 170 and the pixel defining layer 160. The second electrode 180 may be formed by a printing process, a sputtering process, a CVD process, a PLD process, a vacuum evaporation process, an ALD process, etc.

Figure 11E:
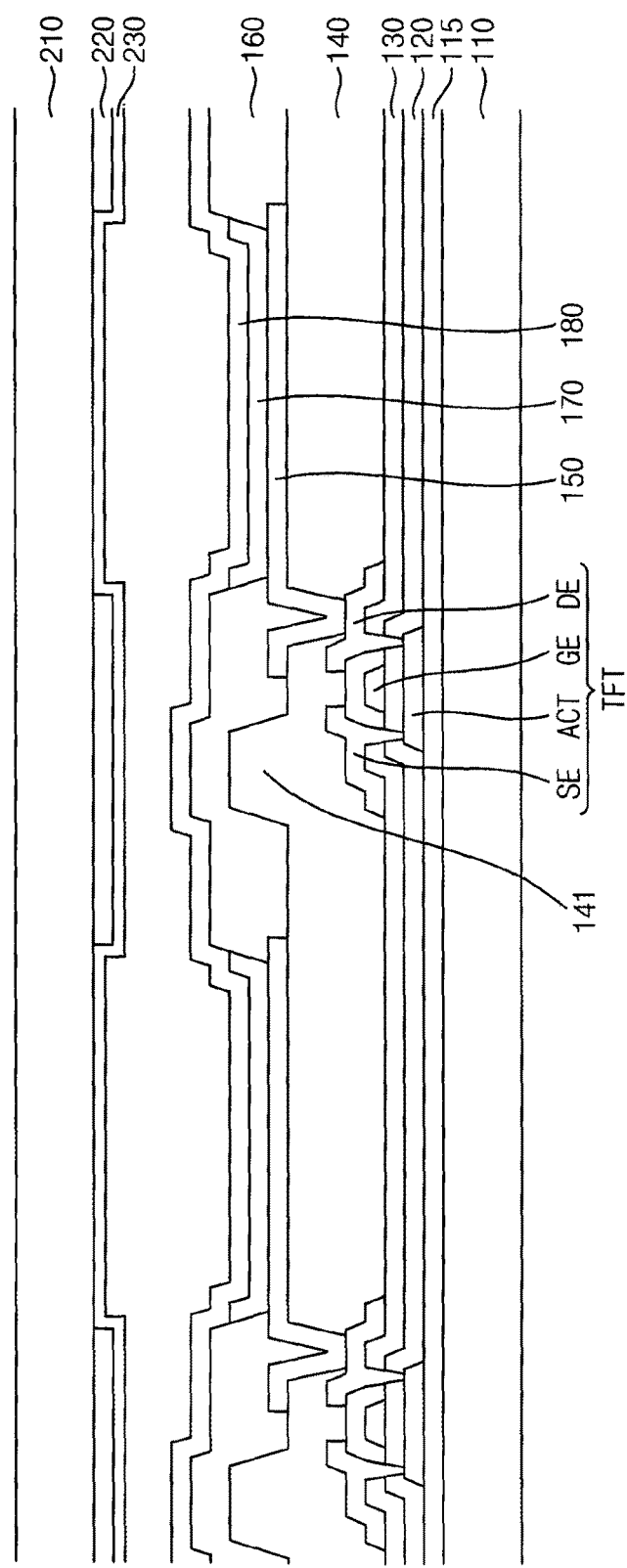

Referring to FIG. 11E, a first mirror layer 220 and a second mirror layer 230 may be formed on a second base substrate 210. The organic light emitting display panel may be formed by locating the second substrate 210 on which the first mirror layer 220 and the second mirror layer 230 to face the first base substrate 110 on which the second electrode 180 is formed.

Figure 12A:
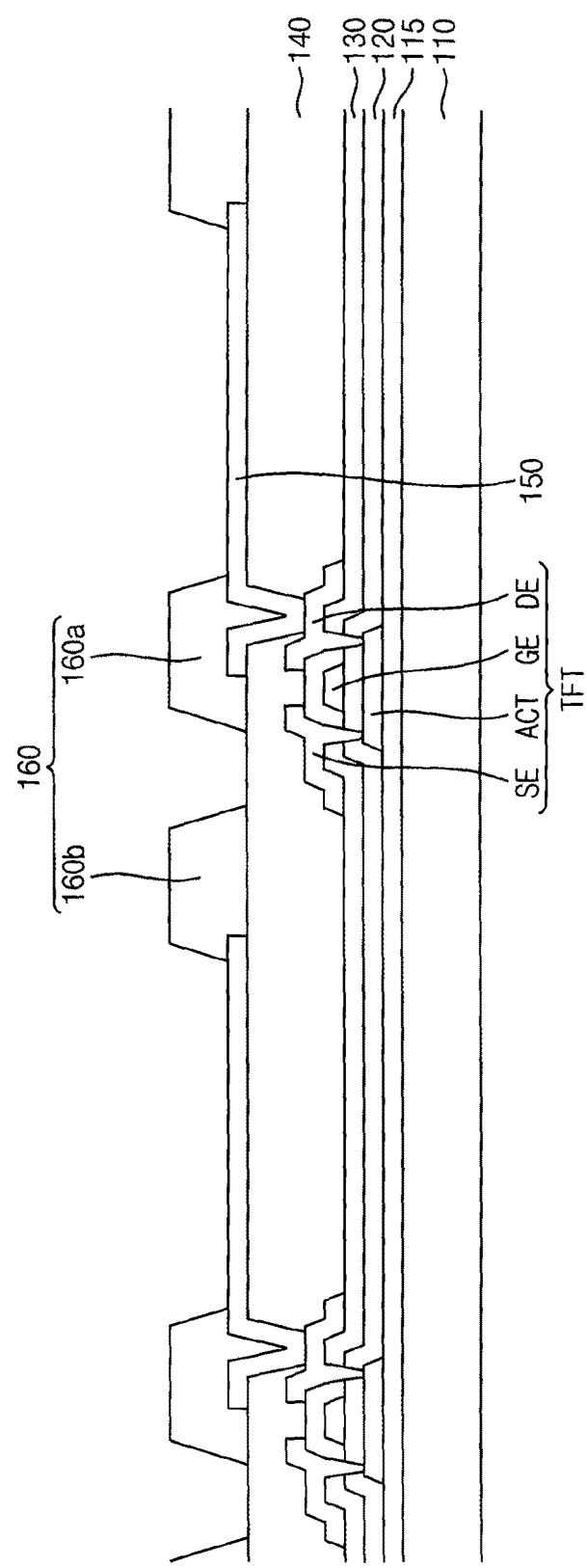
FIGS. 12A to 12C are cross-sectional views illustrating a method of manufacturing the organic light emitting display panel of FIG. 4.
Figure 12B:
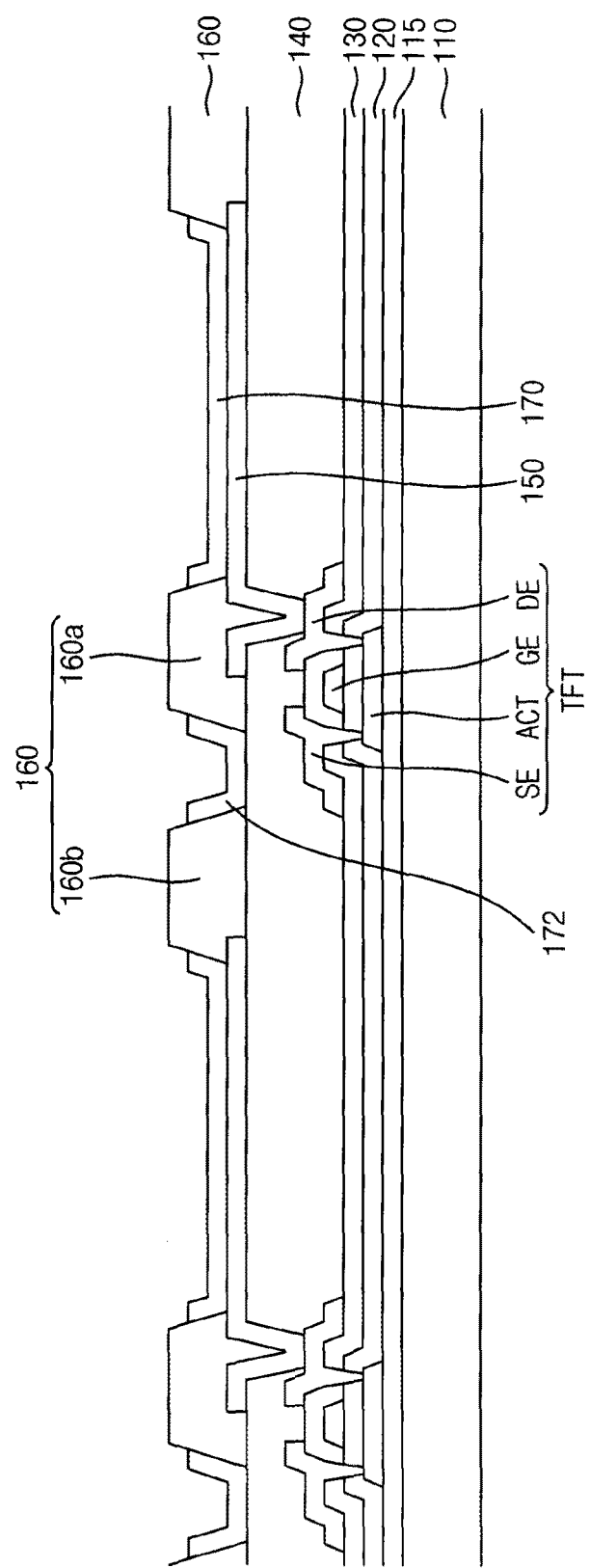
Figure 12C:
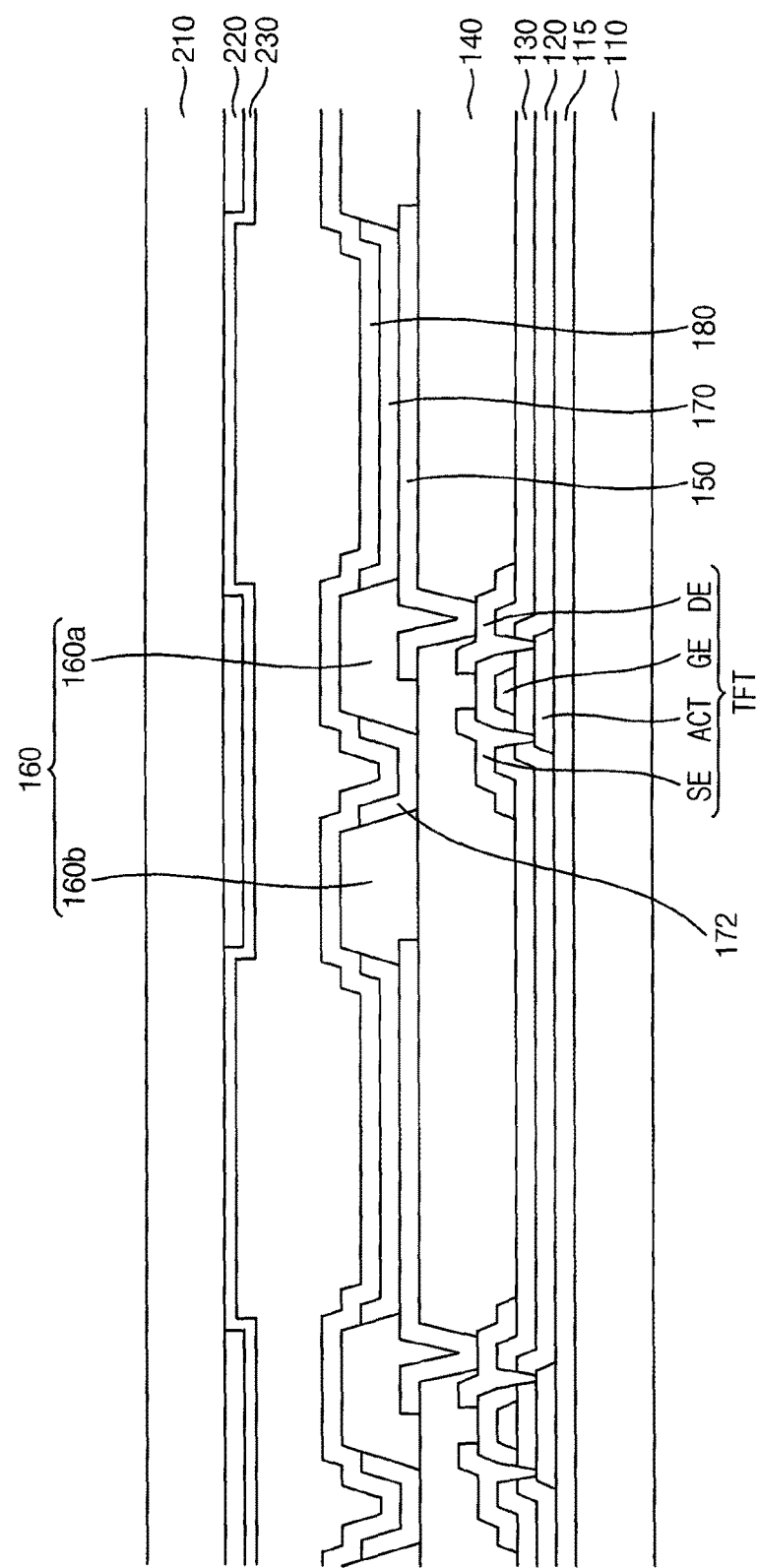

FIGS. 12A to 12C are cross-sectional views illustrating a method of manufacturing the organic light emitting display panel of FIG. 4. Referring to FIG. 12A, a buffer layer 115 may be formed on a first base substrate 110. An active pattern ACT may be formed on the buffer layer 115. A first insulation layer 120 may be formed on the buffer layer 115 on which the active pattern ACT is formed. A gate pattern that includes a gate electrode GE may be formed on the first insulation layer 120. A second insulation layer 130 may be formed on the first insulation layer 120 on which the gate pattern is formed. A data pattern including a source electrode SE and a drain electrode DE may be formed on the second insulation layer 130. A planarization layer 140 may be formed on the second insulation layer 130 on which the data pattern is formed. A first electrode 150 may be formed on the planarization layer 140.

A pixel defining layer 160 may be formed on the planarization layer 140 on which the first electrode 150 is formed. The pixel defining layer 160 may include a first portion 160a and a second portion 160b. The first portion 160a may make contact with a first electrode of an adjacent pixel. The first portion 160a and the second portion 160b may be spaced apart from each other in a cross-sectional view.

Referring to FIG. 12B, a light emitting structure 170 may be formed on the first electrode 150. The light emitting structure 170 may be formed by a laser-induced thermal imaging process, a printing process, etc. A second light blocking pattern 172 may be formed on the planarization layer 140, a side surface of the first portion 160a and a side surface of the second portion 160h between the first portion 160a and the second portion 160b. A second light blocking pattern 172 may be formed on the planarization layer 140, the side surface of the first portion 160a and the side surface of the second portion 160b. The second light blocking pattern 172 may include a material that is same as is the one included in the light blocking structure 170. The second light blocking pattern 172 and the light emitting structure 170 may be simultaneously formed by the same process. In some example embodiment, the second light blocking pattern 172 may include a light-blocking material, and may formed through a separate process.

Referring to FIG. 12C, a second electrode 180 may be formed on the light emitting structure 170 and the pixel defining layer 160. A first mirror layer 220 and a second mirror layer 230 may be formed on a second base substrate 210. The organic light emitting display panel may be formed by locating the second substrate 210 on which the first mirror layer 220 and the second mirror layer 230 to face the first base substrate 110 on which the second electrode 180 is formed.

The foregoing is illustrative of the present disclosure and is not to be construed as limiting thereof. Although some exemplary embodiments of the present disclosure have been described, those skilled in the art will readily appreciate that many modifications are possible in the exemplary embodiments without materially departing from the novel teachings and advantages of the present disclosure. Accordingly, all such modifications are intended to be included within the scope of the present disclosure. In the claims, means-plus-function clauses are intended to cover the structures described herein as performing the recited function and not only structural equivalents but also equivalent structures. Therefore, it is to be understood that the foregoing is illustrative of the present disclosure and is not to be construed as limited to the specific exemplary embodiments disclosed, and that modifications to the disclosed exemplary embodiments, as well as other exemplary embodiments, are intended to be included within the scope of the present disclosure.

What is claimed is:

1. An organic light emitting display panel, comprising:
   a first base substrate;
   a thin film transistor disposed on the first base substrate;
   a first electrode electrically connected to the thin film transistor;
   a pixel defining layer defining an opening that exposes a portion of the first electrode;
   a second electrode disposed on the first electrode;
   a light emitting structure disposed between the first electrode and the second electrode;
   a second base substrate disposed on the second electrode;
   a first mirror layer disposed on the second base substrate and defining an opening that overlaps the light emitting structure; and
   a second mirror layer disposed on the first mirror layer,
   wherein the first mirror layer has an uneven surface, and
   wherein the second mirror layer has an even surface that overlaps the uneven surface of the first mirror layer.

2. The organic light emitting display panel of claim 1, wherein the first mirror layer comprises a first surface that is in parallel with a surface of the second base substrate and a side surface extended from the first surface toward the second base substrate, and
   wherein the first surface and the side surface are uneven.

3. The organic light emitting display panel of claim 1, wherein the second mirror layer is directly disposed on the first mirror layer to cover the first surface and the side surface of the first mirror layer.

4. An organic light emitting display panel, comprising:
   a first base substrate;
   a thin film transistor disposed on the first base substrate;
   a first electrode electrically connected to the thin film transistor;
   a pixel defining layer defining an opening that exposes a portion of the first electrode;
   a second electrode disposed on the first electrode;
   a light emitting structure disposed between the first electrode and the second electrode;
   a second base substrate disposed on the second electrode; and
   a first mirror layer disposed on the second base substrate and defining an opening that overlaps the light emitting structure,
   wherein the pixel defining layer comprises an upper surface that is in parallel with a surface of the first base substrate and a side surface, and
   wherein the upper surface of the pixel defining layer is uneven, and the side surface of the pixel defining layer is even.

5. The organic light emitting display panel of claim 4, wherein the pixel defining layer comprises a first portion and a second portion that are disposed between the first electrode and a first electrode of an adjacent pixel, and
   wherein the first portion is spaced apart from the second portion in a cross-sectional view.

6. An organic light emitting display panel, comprising:
   a first base substrate;
   a thin film transistor disposed on the first base substrate;
   a first electrode electrically connected to the thin film transistor;
   a pixel defining layer defining an opening that exposes a portion of the first electrode;
   a second electrode disposed on the first electrode;
   a light emitting structure disposed between the first electrode and the second electrode;
   a second base substrate disposed on the second electrode; and
   a first mirror layer disposed on the second base substrate and defining an opening that overlaps the light emitting structure,
   wherein a light blocking element is disposed between the first electrode and a first electrode of an adjacent pixel, and
   wherein a height of the light blocking element from the first base substrate is higher than a height of the light emitting structure from the first base substrate.

7. The organic light emitting display panel of claim 6, wherein the pixel defining layer comprises first and second portions that are disposed between the first electrode and a first electrode of the adjacent pixel, the first portion is spaced apart from the second portion in a cross-sectional view, and
   wherein the light blocking element is disposed on a side surface of the first portion and a side surface of the second portion.

8. The organic light emitting display panel of claim 7, wherein the light blocking element is disposed between the first portion and the second portion.

9. The organic light emitting display panel of claim 8, wherein the light blocking element comprises an organic material.

10. The organic light emitting display panel of claim 6, wherein the pixel defining layer comprises a first portion and a second portion, and
    wherein the light blocking element is disposed between the first portion and the second portion of the pixel defining layer.

11. The organic light emitting display panel of claim 6, further comprising a planarization layer that covers the thin film transistor and makes contact with the pixel defining layer, and
    wherein the planarization layer further comprises a light blocking portion protruded from an upper surface of the planarization layer.

12. A method of manufacturing an organic light emitting display panel, comprising:
    forming a thin film transistor on a first base substrate;
    forming a planarization layer on the thin film transistor;
    forming a light blocking element configured to prevent mixing of light between adjacent pixels;
    forming a first electrode on the planarization layer;
    forming a pixel defining layer on the planarization layer;
    forming a light emitting structure on the first electrode;
    forming a second electrode on the light emitting structure and the pixel defining layer;
    forming a first mirror layer on a second base substrate; and
    forming unevenness on a surface of the first mirror layer,
    wherein forming the light blocking element includes forming the unevenness.

13. The method of claim 12, wherein the pixel defining layer comprises a first portion and a second portion that are disposed between the first electrode and a first electrode of an adjacent pixel,
    wherein the first portion is spaced apart from the second portion in a cross-sectional view, and
    wherein the light blocking element is disposed on a side surface of the first portion and a side surface of the second portion.

14. The method of claim 13, wherein forming the light blocking element includes forming unevenness on the pixel defining layer.

15. The method of claim 12, wherein the planarization layer further comprises a light blocking portion protruded from an upper surface of the planarization layer, and the light blocking element is the light blocking portion.

16. The method of claim 12, wherein forming the light blocking element includes forming a light blocking pattern on the planarization layer.

\* \* \* \* \*